United States Patent
Chen et al.

(10) Patent No.: US 12,432,929 B2
(45) Date of Patent: Sep. 30, 2025

(54) FERROELECTRIC MEMORY DEVICE WITH BLOCKING LAYER

(71) Applicant: Taiwan Semiconductor Manufacturing Company, Ltd., Hsinchu (TW)

(72) Inventors: Tzu-Yu Chen, Kaohsiung (TW); Chu-Jie Huang, Tainan (TW); Wan-Chen Chen, Hsinchu (TW); Fu-Chen Chang, New Taipei (TW); Sheng-Hung Shih, Hsinchu (TW); Kuo-Chi Tu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 463 days.

(21) Appl. No.: 18/150,289

(22) Filed: Jan. 5, 2023

(65) Prior Publication Data

US 2024/0040800 A1 Feb. 1, 2024

Related U.S. Application Data

(60) Provisional application No. 63/415,707, filed on Oct. 13, 2022, provisional application No. 63/392,919, filed on Jul. 28, 2022.

(51) Int. Cl.
*H10B 53/30* (2023.01)
*H01L 23/522* (2006.01)
(Continued)

(52) U.S. Cl.
CPC ......... *H10B 53/30* (2023.02); *H01L 23/5226* (2013.01); *H01L 23/5283* (2013.01); *H10B 53/10* (2023.02)

(58) Field of Classification Search
CPC ..... H10B 53/30; H10B 53/10; H01L 23/5226; H01L 23/5283
(Continued)

(56) References Cited

U.S. PATENT DOCUMENTS

| 8,895,377 B2 | 11/2014 | Yamazaki |
| 11,183,503 B2 | 11/2021 | Chen et al. |

(Continued)

FOREIGN PATENT DOCUMENTS

| CN | 1358326 A | 7/2002 |
| JP | 2004134820 A | 4/2004 |
| JP | 2020113604 A | 7/2020 |

*Primary Examiner* — Tu-Tu V Ho
(74) *Attorney, Agent, or Firm* — Eschweiler & Potashnik, LLC

(57) ABSTRACT

Various embodiments of the present disclosure are directed towards a memory cell comprising a blocking layer configured to block diffusion of metal from an electrode of the memory cell to a ferroelectric layer of the memory cell. More particularly, the blocking layer and the ferroelectric layer are between a top electrode of the memory cell and a bottom electrode of the memory cell, which both comprise metal. Further, the blocking layer is between the ferroelectric layer and the electrode, which corresponds to one of the top and bottom electrodes. In some embodiments, the metal of the one of the top and bottom electrodes has a lowest electronegativity amongst the metals of top and bottom electrodes and is hence the most reactive and likely to diffuse amongst the metals of top and bottom electrodes.

20 Claims, 21 Drawing Sheets

(51) Int. Cl.
*H01L 23/528* (2006.01)
*H10B 53/10* (2023.01)

(58) Field of Classification Search
USPC .......................................................... 257/295
See application file for complete search history.

(56) References Cited

U.S. PATENT DOCUMENTS

| | | |
|---|---|---|
| 11,195,840 B2 | 12/2021 | Chen et al. |
| 11,296,099 B2 | 4/2022 | Chen et al. |
| 11,837,270 B2 * | 12/2023 | Okuno .................. H10B 53/30 |
| 2003/0047764 A1 | 3/2003 | Joo |
| 2006/0232133 A1 | 10/2006 | Cha |
| 2012/0032300 A1 | 2/2012 | Wang |
| 2018/0366476 A1 | 12/2018 | Liu |
| 2021/0359082 A1 | 11/2021 | Kang |
| 2022/0278115 A1 | 9/2022 | Wei et al. |
| 2023/0079435 A1 | 3/2023 | Oka et al. |

* cited by examiner

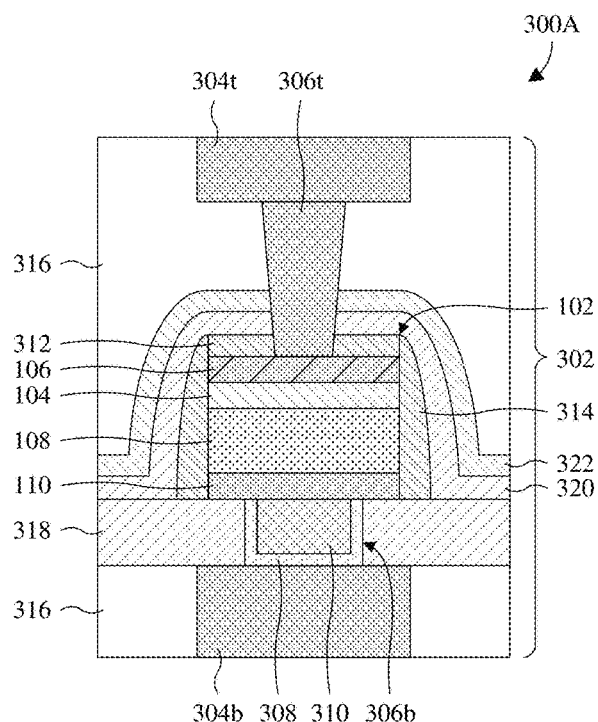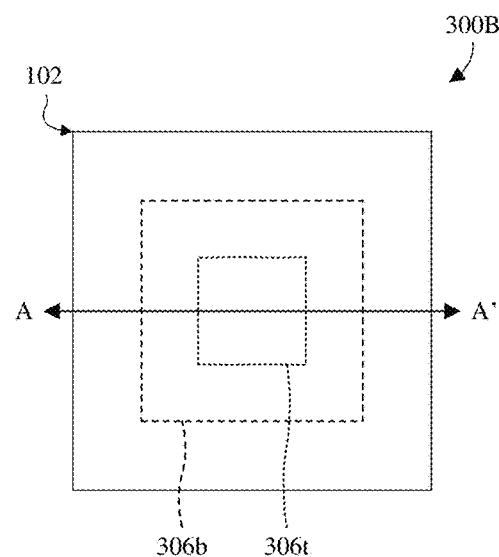
Fig. 3A  Fig. 3B
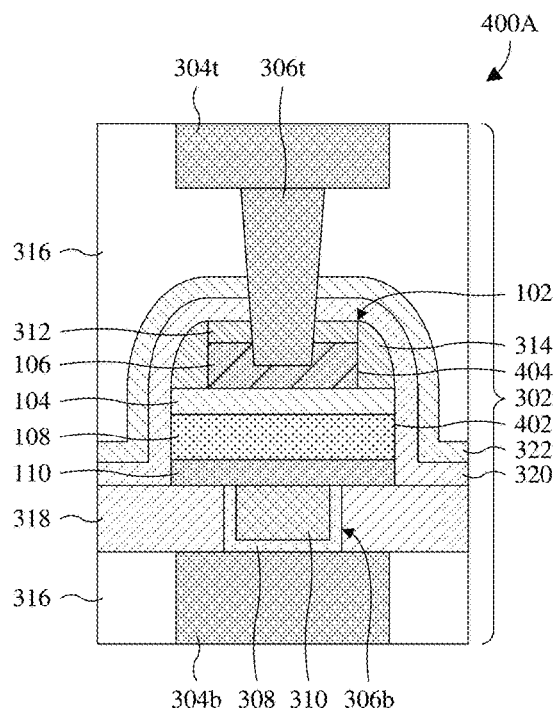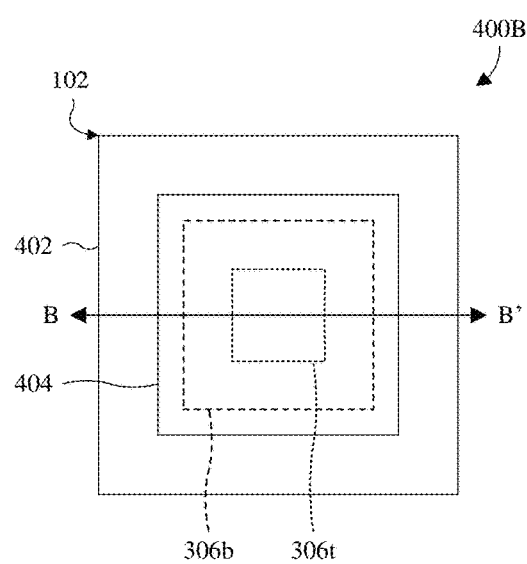
Fig. 4A  Fig. 4B

FERROELECTRIC MEMORY DEVICE WITH BLOCKING LAYER

REFERENCE TO RELATED APPLICATIONS

This application claims the benefit of U.S. Provisional Application No. 63/392,919, filed on Jul. 28, 2022 & U.S. Provisional Application No. 63/415,707, filed on Oct. 13, 2022. The contents of the above-referenced Patent Applications are hereby incorporated by reference in their entirety.

BACKGROUND

Many modern-day electronic devices include non-volatile memory. Non-volatile memory is electronic memory that is able to store data in the absence of power. Promising candidates for the next generation of non-volatile memory include ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B illustrate various views of some embodiments of the memory cell of FIG. 1 in which the memory cell is integrated into an interconnect structure of an integrated circuit (IC) chip.

FIGS. 4A and 4B illustrate various views of some alternative embodiments of the memory cell of FIGS. 3A and 3B in which a top-electrode width is reduced relative to a remainder of the memory cell.

DETAILED DESCRIPTION

Figure 1:
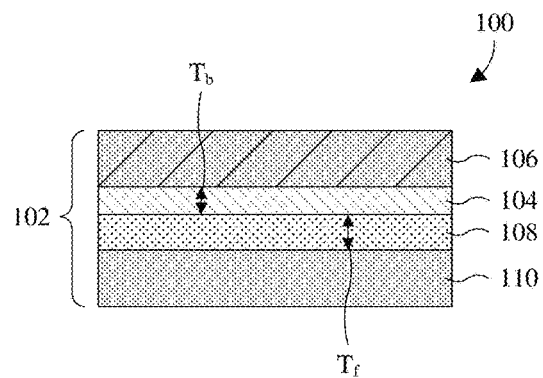
FIG. 1 illustrates a cross-sectional view of some embodiments of a memory cell comprising a blocking layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) chip may comprise an interconnect structure and a memory cell in the interconnect structure. The memory cell comprises a bottom electrode, a ferroelectric layer overlying and directly contacting the bottom electrode, and a top electrode overlying and directly contacting the ferroelectric layer. The interconnect structure comprises a bottom electrode wire underlying the memory cell and a top electrode wire overlying the memory cell. Further, the interconnect structure comprises vias extending respectively from the bottom and top electrode wires respectively to the bottom and top electrodes.

A challenge with the memory cell is that the top electrode may comprise a metal with a low electronegativity and/or the bottom electrode may comprise a metal with a low electronegativity. Such a low electronegativity may, for example, be less than about 1.6 or some other suitable value. Metal with a low electronegativity has a high reactivity and hence a high propensity to diffuse during annealing. As such, the metal of the top electrode and/or the metal of the bottom electrode may have a high propensity to diffuse to the ferroelectric layer during annealing to increase a ferroelectric phase of the ferroelectric layer.

Metal that diffuses to the ferroelectric layer from the top electrode and/or from the bottom electrode negatively impacts performance of the ferroelectric layer and hence of the memory cell. For example, a ferroelectric phase may be decreased, remnant polarization (2Pr) may be decreased, polarization uniformity may be decreased, leakage current may be increased, capacitance may be decreased, data retention may be decreased, breakdown voltage may be decreased, or any combination of the foregoing.

Various embodiments of the present disclosure are directed towards a memory cell comprising a blocking layer configured to block diffusion of metal from an electrode of the memory cell to a ferroelectric layer of the memory cell. More particularly, the blocking layer and the ferroelectric layer are between a top electrode of the memory cell and a bottom electrode of the memory cell, and the top and bottom electrodes comprise individual metals. Further, the blocking layer is between the ferroelectric layer and one of the top and bottom electrodes. In some embodiments, the metal of the one of the top and bottom electrodes has a lowest electronegativity amongst the metal of top and bottom electrodes and is hence the most reactive and likely to diffuse amongst the metal of top and bottom electrodes.

Because of the blocking layer, metal diffusion to the ferroelectric layer may be minimized, including during annealing to increase the ferroelectric phase of the ferroelectric layer. By preventing metal from diffusing to the ferroelectric layer, performance of the ferroelectric layer and hence of the memory cell may be enhanced. For example, a ferroelectric phase may be increased, remnant polarization (2Pr) may be increased, polarization uniformity may be increased, leakage current may be decreased, capacitance may be increased, data retention may be increased, breakdown voltage may be increased, or any combination of the foregoing. Further, the memory cell is compatible with logic manufacturing process, whereby the memory device cell be used for embedded memory applications.

With reference to FIG. 1, a cross-sectional view 100 of some embodiments of a memory cell 102 is provided in which a blocking layer 104 is configured to block diffusion of metal from a top electrode 106 to a ferroelectric layer 108. In some embodiments, the blocking layer 104 may additionally or alternatively be referred to as an interfacial layer, an intermixing layer, a diffusion barrier layer, the like, or any combination of the foregoing. The memory cell 102 may, for example, be or comprise a metal-ferroelectric-metal (MFM) cell, a ferroelectric capacitor, a ferroelectric tunnel junction (FTJ), the like, or any combination of the foregoing.

The ferroelectric layer 108 overlies a bottom electrode 110, the blocking layer 104 overlies the ferroelectric layer 108, and the top electrode 106 overlies the blocking layer 104. Further, the bottom and top electrodes 110, 106 comprise individual metals, and the metals of the bottom and top electrodes 110, 106 respectively have a high electronegativity and a low electronegativity. Note that the low electronegativity is schematically illustrated by diagonal hashing overlaid on the top electrode 106. Because of the low electronegativity, the metal of the top electrode 106 has high reactivity and hence a high propensity to diffuse to the ferroelectric layer 108. In contrast, because of the high electronegativity, the metal of the bottom electrode 110 has low reactivity and hence a low propensity to diffuse to the ferroelectric layer 108.

In some embodiments, the high electronegativity and the low electronegativity are relative to each other. In some embodiments, the high electronegativity is an electronegativity greater than about 1.6, about 2.0, or some other suitable value, and/or is an electronegativity of about 1.6-2.4, about 1.6-2.0, about 2.0-2.4, or some other suitable value. In some embodiments, the low electronegativity is an electronegativity less than about 1.6, about 1.5, or some other suitable value, and/or is an electronegativity of about 1.1-1.6 or some other suitable value.

Metal that diffuses to the ferroelectric layer 108 negatively impacts performance of the ferroelectric layer 108 and hence of the memory cell 102. Because the bottom electrode 110 has the high electronegativity, diffusion of metal from the bottom electrode 110 to the ferroelectric layer 108 may be minimal. In contrast, because the top electrode 106 has the low electronegativity, diffusion of metal from the top electrode 106 to the ferroelectric layer 108 may be significant. Therefore, arranging the blocking layer 104 between the top electrode 106 and the ferroelectric layer 108 may significantly reduce diffusion of metal to the ferroelectric layer 108. Further, the blocking layer 104 may be more effective at reducing metal diffusion to the ferroelectric layer 108 than if between the bottom electrode 110 and the ferroelectric layer 108.

By reducing diffusion of metal to the ferroelectric layer 108, the blocking layer 104 enhances performance of the ferroelectric layer 108 and hence of the memory cell 102. For example, a ferroelectric phase may be increased, remnant polarization (2Pr) may be increased, polarization uniformity may be increased, leakage current may be decreased, capacitance may be increased, data retention may be increased, breakdown voltage may be increased, or any combination of the foregoing. Further, as will be better seen hereafter, manufacture of the blocking layer 104 is compatible with logic manufacturing process, whereby the blocking layer 104 may be used in memory cells for embedded memory applications.

The ferroelectric phase referenced above corresponds to the orthorhombic phase and is to be contrasted with the tetragonal phase and the monoclinic phase. The higher a ratio of the orthorhombic phase to other phases, the higher the remnant polarization (2Pr) and hence the better the data retention. Hence, the blocking layer 104 increases the ratio of the orthorhombic phase to other phases. The ferroelectric phase may, for example, be measured and/or quantified by x-ray diffraction (XRD), electron backscatter diffraction (EBSD), or the like.

As described above, the bottom electrode 110 comprises a metal with a high electronegativity, and the top electrode 106 comprises a metal with a low electronegativity. In some embodiments, the low-electronegativity metal is or comprises titanium (e.g., Ti/an electronegativity of 1.54), tantalum (e.g., Ta/an electronegativity of 1.51), lanthanum (e.g., La/an electronegativity of 1.11), some other suitable metals, or any combination of the foregoing. In some embodiments, the high-electronegativity metal is or comprises molybdenum (e.g., Mo/an electronegativity of 2.16), tungsten (e.g., W/an electronegativity of 2.36), ruthenium (e.g., Ru/an electronegativity of 2.2), osmium (e.g., Os/an electronegativity of 2.18), rhodium (e.g., Rh/an electronegativity of 2.28), iridium (e.g., Jr/an electronegativity of 2.2), palladium (e.g., Pd/an electronegativity of 2.2), platinum (e.g., Pt/an electronegativity of 2.28), copper (e.g., Cu/an electronegativity of 1.9), silver (e.g., Ag/an electronegativity of 1.93), gold (e.g., Au/an electronegativity of 2.54), aluminum (e.g., Al/an electronegativity of 1.61), some other suitable metals, or any combination of the foregoing.

In some embodiments, the blocking layer 104 is or comprises silicon oxide (e.g., SiOx), silicon nitride (e.g., SiNx), metal oxide, a high k dielectric, some other suitable material(s), or any combination of the foregoing. The high k dielectric may, for example, be a dielectric with a dielectric constant greater than about 3.9, about 10, or some other suitable value. In some embodiments, the blocking layer 104 is a dielectric. For example, the blocking layer 104 may be or comprise silicon oxide, silicon nitride, a high k dielectric, or some other suitable dielectric. In some embodiments, the blocking layer 104 is a semiconductor. For example, the blocking layer 104 may be or comprise a semiconductor metal oxide or some other suitable semiconductor material. In some embodiments, the blocking layer 104 is conductive. For example, the blocking layer 104 may be or comprise a conductive metal oxide or some other suitable conductive material.

In some embodiments in which the blocking layer 104 is or comprises a metal oxide, the metal of the metal oxide has a high electronegativity. In some embodiments, the high electronegativity is high relative to an electronegativity of metal of the top electrode 106. Further, in some embodiments, the high electronegativity is an electronegativity greater than about 1.6, about 2.0, or some other suitable value, and/or is an electronegativity of about 1.6-2.4, about 1.6-2.0, about 2.0-2.4, or some other suitable value.

In some embodiments, the blocking layer 104 comprises metal diffusing from the top electrode 106 towards the ferroelectric layer 108. In some embodiments, the blocking layer 104 has an amorphous structure so as to eliminate grain boundaries and to increase diffusion-path complexity. Alternatively, in some embodiments, the blocking layer 104 has a nanocrystalline structure and grains of the blocking layer 104 are equiaxed grains, instead of columnar grains, so as to increase diffusion-path complexity. By increasing diffusion-path complexity, diffusion of metal thought the blocking layer 104 is reduced.

In some embodiments, the blocking layer 104 has a thickness Tb of about 2-50 angstroms, about 2-26 angstroms, about 26-50 angstroms, or some other suitable value. If the thickness Tb is too small (e.g., less than 2 angstroms), the blocking layer 104 may not effectively block diffusion of metal from the top electrode 106 to the ferroelectric layer 108. If the thickness Tb is too large (e.g., more than 50 angstroms), a resistance of the blocking layer 104 may be too high and may lead to low current flow through the memory cell 102.

In some embodiments, metal of the top electrode 106 minimally diffuses to the ferroelectric layer 108 even with the blocking layer 104. For example, an atomic percentage of the metal in the ferroelectric layer 108 may be a non-zero value less than about 10%, about 5%, about 1%, or some other suitable percentage, and/or may be about 1%-10%, about 1%-5%, about 5%-10%, or some other suitable percentage. In some embodiments, the minimal diffusion wholly or mostly occurs during an anneal to increase a ferroelectric phase of the ferroelectric layer 108. In some of such embodiments, an atomic percentage of the metal in the ferroelectric layer 108 is less than 10% at completion of the anneal when the blocking layer 104 is present and is more than 30% at completion of the anneal when the blocking layer 104 is absent.

In some embodiments, the ferroelectric layer 108 is or comprises a binary oxide, a ternary oxide or nitride, a quaternary oxide, some other suitable ferroelectric material(s), or any combination of the foregoing. The binary oxide may, for example, be or comprise hafnium oxide (e.g., hafnia or $HfO_2$) and/or some other suitable binary oxide(s). The ternary oxide or nitride may, for example, be or comprise hafnium silicate (e.g., $HfSiO_x$), hafnium zirconate (e.g., $HfZrO_x$), barium titanate (e.g., $BaTiO_3$), lead titanate (e.g., $PbTiO_3$), strontium titanate (e.g., $SrTiO_3$), calcium manganite (e.g., $CaMnO_3$), bismuth ferrite (e.g., $BiFeO_3$), aluminum scandium nitride (e.g., AlScN), aluminum gallium nitride (e.g., AlGaN), aluminum yttrium nitride (e.g., AlYN), some other suitable ternary oxide(s) and/or nitride(s), or any combination of the foregoing. The quaternary oxide may, for example, be or comprise barium strontium titanate (e.g., $BaSrTiO_x$) and/or some other suitable quaternary oxide(s).

In some embodiments, the ferroelectric layer 108 has a nonmetal element with an electronegativity greater than an electronegativity of the metal of the top electrode 106. In such embodiments, the difference between the electronegativity of the nonmetal element and the metal of the top electrode is at least 1.7, 1.84, or some other suitable value, and/or is about 1.6-2.5, about 1.6-2.05, about 2.05-2.5, about 1.9-2.33, or some other suitable value. The non-metal element may, for example, be oxygen or the like.

In some embodiments, a thickness $T_f$ of the ferroelectric layer 108 is about 10-200 angstroms, about 10-105 angstroms, about 105-200 angstroms, or some other suitable value. If the thickness $T_f$ is too small (e.g., less than 10 angstroms) or is too large (e.g., greater than 200 angstroms), the ferroelectric layer 108 may have no remanent polarization or may have an unusably small remanent polarization. Further, if the thickness $T_f$ is too large (e.g., greater than 200 angstroms), a resistance of the ferroelectric layer 108 may be too high and may lead to low current flow through the memory cell 102.

During operation of the memory cell 102, the remanent polarization of the ferroelectric layer 108 is used to represent a bit of data. For example, a positive polarity of the remanent polarization may represent a binary "0", whereas a negative polarity of the remanent polarization may represent a binary "1", or vice versa.

To set the remanent polarization to the positive polarity, a first write voltage is applied across the ferroelectric layer 108 from the top electrode 106 to the bottom electrode 110. To set the remanent polarization to the negative polarity, a second write voltage is applied across the ferroelectric layer 108 from the top electrode 106 to the bottom electrode 110. The first and second write voltages have opposite polarities and have magnitudes in excess of the coercive voltage. In some embodiments, to read the polarity of the remanent polarization, the remanent polarization is set to the positive or negative polarity as above. If the polarity of the remanent polarization changes, a current pulse occurs. Otherwise, no current pulse occurs. Hence, the current pulse may be used to identify the polarity of the remanent polarization.

Figure 2A:
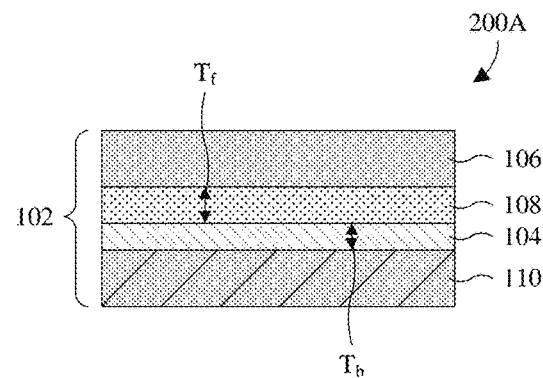
FIGS. 2A and 2B illustrate cross-sectional views of some alternative embodiments of the memory cell of FIG. 1.
Figure 2B:
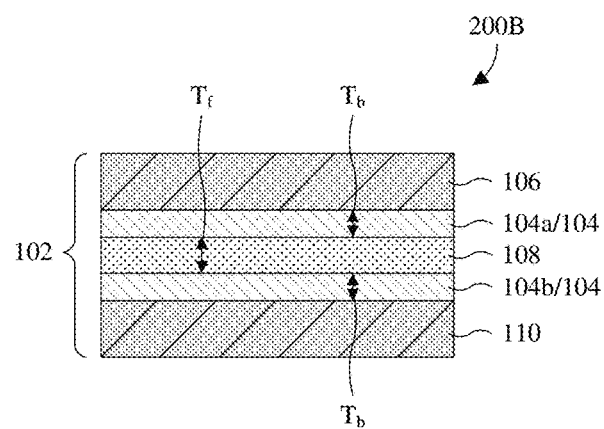

With reference to FIGS. 2A and 2B, cross-sectional views 200A, 200B of some alternative embodiments of the memory cell 102 of FIG. 1 are provided.

In FIG. 2A, the blocking layer 104 is between the bottom electrode 110 and the ferroelectric layer 108, instead of between the top electrode 106 and the ferroelectric layer 108. Further, the metal of the bottom electrode 110 has the low electronegativity, and the metal of the top electrode 106 has the high electronegativity. The low electronegativity is schematically illustrated by the diagonal hashing overlaid on the bottom electrode 110. Further, non-limiting examples of low-electronegativity metal and high-electronegativity metal are as above.

Because of the low electronegativity, the metal of the bottom electrode 110 has high reactivity and hence a high propensity to diffuse to the ferroelectric layer 108. In contrast, because of the high electronegativity, the metal of the top electrode 106 has low reactivity and hence a low propensity to diffuse to the ferroelectric layer 108. Therefore, by arranging the blocking layer 104 between the bottom electrode 110 and the ferroelectric layer 108, diffusion of metal to the ferroelectric layer 108 may be significantly reduced. This may significantly enhance performance of the ferroelectric layer 108 and hence of the memory cell 102.

In some embodiments in which the blocking layer 104 is or comprises a metal oxide, the metal of the metal oxide has a high electronegativity. In some embodiments, the high electronegativity is high relative to an electronegativity of metal of the bottom electrode 110. Further, in some embodiments, the high electronegativity is an electronegativity greater than about 1.6, about 2.0, or some other suitable value, and/or is an electronegativity of about 1.6-2.4, about 1.6-2.0, about 2.0-2.4, or some other suitable value.

In FIG. 2B, the memory cell 102 has a pair of blocking layers 104, each as their counterpart is described with regard to FIG. 1. A first blocking layer 104a between the top electrode 106 and the ferroelectric layer 108 blocks diffusion of metal from the top electrode 106 to the ferroelectric layer 108. A second blocking layer 104b between the bottom electrode 110 and the ferroelectric layer 108 blocks diffusion of metal from the bottom electrode 110 to the ferroelectric layer 108. By blocking metal from diffusing to the ferroelectric layer 108, the first and second blocking layers 104a, 104b may significantly enhance performance of the ferroelectric layer 108 and hence of the memory cell 102.

In some embodiments, metal of the bottom electrode 110 and metal of the top electrode 106 both have the low electronegativity. The low electronegativity is schematically illustrated by the diagonal hashing overlaid on the bottom and top electrodes 110, 106. In some embodiments, the low electronegativity is an electronegativity less than about 1.6, about 1.5, or some other suitable value, and/or is an electronegativity of about 1.1-1.6 or some other suitable value. Further, in some embodiments in which the first and second blocking layers 104a, 104b comprise metal oxide, the low electronegativity is low relative to an electronegativity of the metal of the metal oxide. Non-limiting examples of low-electronegativity metal are as above.

While FIGS. 1 and 2A describe the blocking layer 104 as being at an electrode with a lowest metal electronegativity amongst the top and bottom electrodes 106, 110, this may not be the case in alternative embodiments. For example, the blocking layer 104 may alternatively be at an electrode with a highest metal electronegativity or the top and bottom electrodes 106, 110 may have the same metal electronegativity, which may be high or low. Further, while FIGS. 1 and 2A describe one of the top and bottom electrodes 106, 110 as having a low metal electronegativity and another one of the top and bottom electrodes 106, 110 as having a high metal electronegativity, this may be reversed in alternative embodiments or both the top and bottom electrodes 106, 110 may have a low or high metal electronegativity in alternative embodiments. While FIG. 2B describes the top and bottom electrodes 106, 110 as having a low metal electronegativity, the top and bottom electrodes 106, 110 may alternatively have a high metal electronegativity.

While FIGS. 1, 2A, and 2B describe metals of the bottom and top electrodes in terms of electronegativity, the metals may also be described in terms of electropositivity. A metal with a low electronegativity has a high electropositivity, whereas a metal with a high electronegativity has a low electropositivity. Hence, the top and bottom electrodes 106, 110 of FIG. 1 may also be regarded as respectively having a high electropositivity and a low electropositivity, and the top and bottom electrodes 106, 110 of FIG. 2A may also be regarded as respectively having a low electropositivity and a high electropositivity. Further, the top and bottom electrodes 106, 110 of FIG. 2B may be regarded as having a high electropositivity.

With reference to FIG. 3A, a cross-sectional view 300A of some embodiments of the memory cell 102 of FIG. 1 is provided in which the memory cell 102 is integrated into an interconnect structure 302 of an IC chip.

A top electrode wire 304t overlies the memory cell 102, and a top electrode via (TEVA) 306t extends downward from the top electrode wire 304t to the top electrode 106. A bottom electrode wire 304b underlies the memory cell 102, and a bottom electrode via (BEVA) 306b extends upward from the bottom electrode wire 304b to the bottom electrode 110. The BEVA 306b comprises a BEVA barrier 308 and a BEVA body 310. The BEVA barrier 308 cups an underside of the BEVA body 310 to separate the BEVA body 310 from the bottom electrode wire 304b. In alternative embodiments, the BEVA barrier 308 is omitted, such that the BEVA body 310 directly contacts the bottom electrode wire 304b. The BEVA barrier 308 may, for example, be configured to block or otherwise substantially decrease diffusion of material from the bottom electrode wire 304b to the bottom electrode 110.

In some embodiments, the top electrode wire 304t, the TEVA 306t, and the bottom electrode wire 304b are or comprise copper, aluminum, tungsten, the like, or any combination of the foregoing. In some embodiments, the BEVA body 310 is or comprises: (1) a same material as the top electrode wire 304t, the TEVA 306t, the bottom electrode wire 304b, or any combination of the foregoing; (2) a same material as the BEVA barrier 308; (3) a same material as the bottom electrode 110; (4) some other suitable material(s); or (5) any combination of the foregoing. In some embodiments, the BEVA barrier 308 is or comprises titanium nitride, platinum, aluminum copper, gold, titanium, tantalum, tantalum nitride, tungsten, tungsten nitride, the like, or any combination of the foregoing. In some embodiments, a thickness of the BEVA barrier 308 is about 50-200 angstroms or some other suitable value.

A hard mask 312 overlies the top electrode 106, and the TEVA 306t extends through the hard mask 312 from the top electrode wire 304t to the top electrode 106. In alternative embodiments, the hard mask 312 is omitted. The hard mask 312 may, for example, be or comprise titanium nitride, silicon oxide, silicon nitride, silicon carbide nitride, silicon oxide nitride, metal oxide, some other suitable material(s), or any combination of the foregoing. The metal oxide may, for example, be or comprise titanium oxide, aluminum oxide, some other suitable metal oxide(s), or any combination of the foregoing. In some embodiments, a thickness of the hard mask 312 is about 50-400 angstroms or some other suitable value.

As described with regard to FIG. 1, the blocking layer 104 is configured to block metal of the top electrode 106 from diffusing to the ferroelectric layer 108. This may, in turn, enhance performance of the ferroelectric layer 108.

The bottom electrode 110, the ferroelectric layer 108, the blocking layer 104, the top electrode 106, and the hard mask 312 share a common width and form a pair of common sidewalls respectively on opposite sides of the memory cell 102. Further, the common sidewalls have planar profiles but may alternatively have curved profiles or other suitable profiles.

A sidewall spacer structure 314 is on the common sidewalls. The sidewall spacer structure 314 may, for example, be or comprise titanium nitride, silicon oxide, silicon nitride, silicon carbide nitride, silicon oxide nitride, metal oxide, some other suitable material(s), or any combination of the foregoing. The metal oxide may, for example, be or comprise titanium oxide, aluminum oxide, some other suitable metal oxide(s), or any combination of the foregoing. In some embodiments, the sidewall spacer structure 314 is a same material as the hard mask 312.

A plurality of intermetal dielectric (IMD) layers 316 respectively surround the bottom electrode wire 304b and the top electrode wire 304t. Further, a first etch stop layer 318, a second etch stop layer 320, and a buffer layer 322 separate the IMD layers 316. The first etch stop layer 318 surrounds the BEVA 306b, vertically between the bottom electrode wire 304b and the memory cell 102. The second etch stop layer 320 and the buffer layer 322 cover and conform to the first etch stop layer 318 and the memory cell 102. Further, the second etch stop layer 320 is between the buffer layer 322 and the memory cell 102.

The IMD layers 316 may, for example, be or comprise silicon oxide, silicon nitride, silicon carbide, silicon oxycarbide, silicon oxynitride, silicon carbonitride, some other suitable dielectric(s), or any combination of the foregoing. The first etch stop layer 318 and/or the second etch stop layer 320 may, for example, be or comprise metal nitride, metal oxide, metal carbide, silicon nitride, silicon oxide, silicon carbide, silicon oxynitride, some other suitable dielectric(s), or any combination of the foregoing. In some embodiments, the first etch stop layer 318 and the second etch stop layer 320 are a same material. In some embodiments, a thickness of the first etch stop layer 318 is about 150-350 angstroms or some other suitable value. In some embodiments, a thickness of the second etch stop layer 320 is about 50-300 angstroms or some other suitable value. The buffer layer 322 may, for example, be or comprise tetraethyl orthosilicate (TEOS) oxide and/or some other suitable dielectric(s). In some embodiments, a thickness of the buffer layer 322 is about 50-300 angstroms or some other suitable value.

With reference to FIG. 3B, a top layout view 300B of some embodiments of the memory cell 102 of FIG. 3A is provided. Further, top layouts of the BEVA 306b and the TEVA 306t are illustrated in phantom overlaid on the memory cell 102. The cross-sectional view 300A of FIG. 3A may, for example, be taken along line A-A'. The memory cell 102 has a square or rectangular top layout, but may alternatively have a circular top layout or some other suitable top layout. The BEVA 306b and the TEVA 306t have square or rectangular top layouts but may alternatively have other suitable top layouts.

With reference to FIG. 4A, a cross-sectional view 400A of some alternative embodiments of the memory cell 102 of FIG. 3A is provided in which a top-electrode width is reduced relative to a remainder of the memory cell 102.

The bottom electrode 110, the ferroelectric layer 108, and the blocking layer 104 share a first common width and form a pair of first common sidewalls 402 respectively on opposite sides of the memory cell 102. Further, the top electrode 106 and the hard mask 312 share a second common width and form a pair of second common sidewalls 404 respectively on the opposite sides of the memory cell 102. The second common width is less than the first common width, and the second common sidewalls 404 are laterally between the first common sidewalls 402. Further, the second common sidewalls 404 are covered by the sidewall spacer structure 314, which overlies the blocking layer 104. The first and second common sidewalls 402, 404 have planar profiles, but other suitable profiles are amenable.

With reference to FIG. 4B, a top layout view 400B of some embodiments of the memory cell 102 of FIG. 4A is provided. Further, top layouts of the BEVA 306b and the TEVA 306t are illustrated in phantom overlaid on the memory cell 102. The cross-sectional view 400A of FIG. 4A may, for example, be taken along line B-B'. The memory cell 102 has a square or rectangular top layout, and the second common sidewalls 404 are laterally offset from and between the first common sidewalls 402. In alternative embodiments, the memory cell 102 may have a circular top layout or some other suitable top layout. The BEVA 306b and the TEVA 306t have square or rectangular top layouts but may alternatively have other suitable top layouts.

Figure 5:
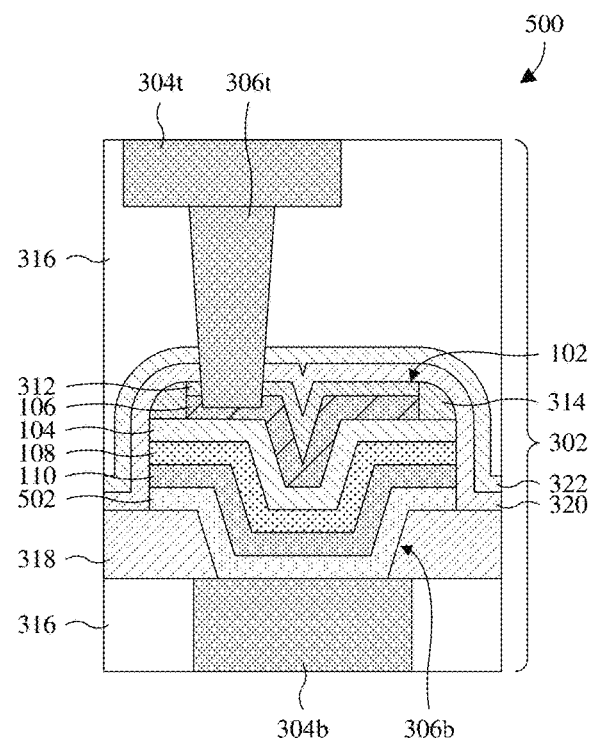
FIG. 5 illustrates a cross-sectional view of some alternative embodiments of the memory cell of FIGS. 4A and 4B.

With reference to FIG. 5, a cross-sectional view 500 of some alternative embodiments of the memory cell 102 of FIG. 4A is provided in which the BEVA barrier 308 and the BEVA body 310 are omitted. Further, a bottom electrode barrier 502 and the bottom electrode 110 form the BEVA 306b. The bottom electrode barrier 502 is between the bottom electrode 110 and the bottom electrode wire 304b and may, for example, be as the BEVA barrier 308 is described with regard to FIG. 3A. The bottom electrode barrier 502, the bottom electrode 110, the ferroelectric layer 108, the blocking layer 104, the top electrode 106, and the hard mask 312 are depressed at the BEVA 306b, and the TEVA 306t is laterally offset from a center of the memory cell 102.

Figures 6A, 6B:
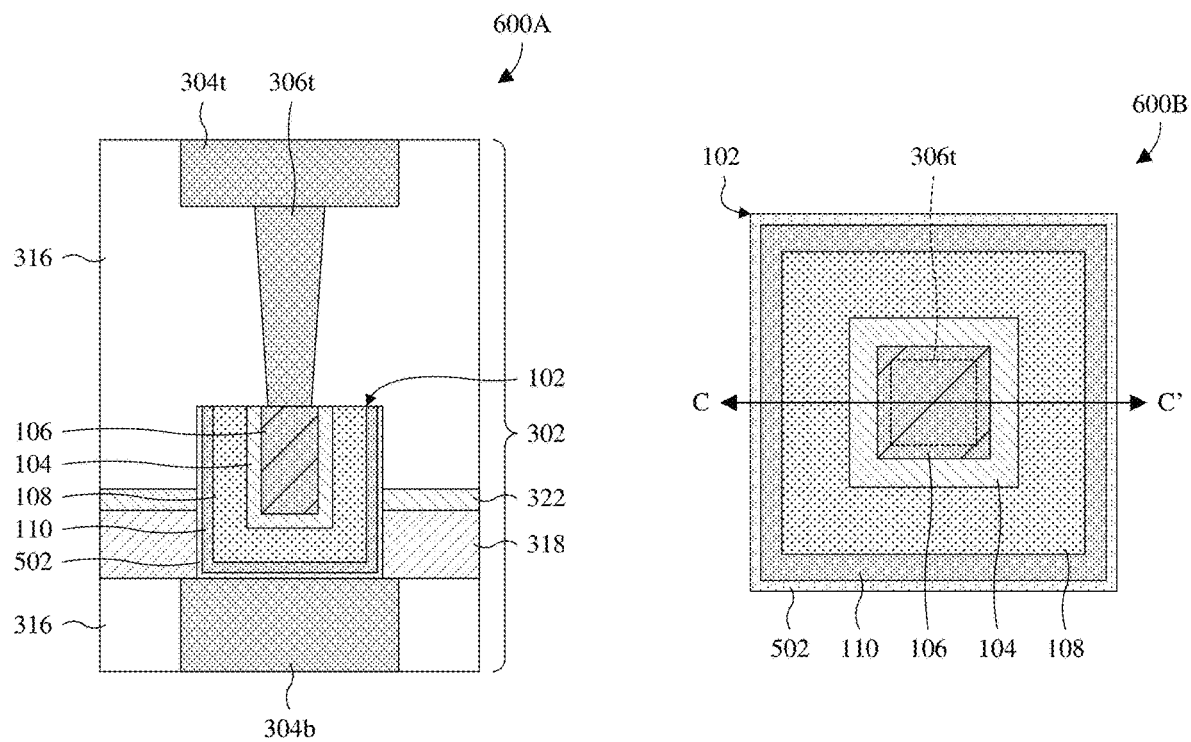
FIGS. 6A and 6B illustrate various views of some alternative embodiments of the memory cell of FIGS. 3A and 3B in which constituents of the memory cell have U-shaped profiles.

With reference to FIG. 6A, a cross-sectional view 600A of some alternative embodiments of the memory cell 102 of FIG. 3A is provided in which the BEVA 306b, the BEVA barrier 308, the BEVA body 310, the sidewall spacer structure 314, the second etch stop layer 320, and the hard mask 312 are omitted. As such, the memory cell 102 extends from the bottom electrode wire 304b. Further, a bottom electrode barrier 502, the bottom electrode 110, the ferroelectric layer 108, and the blocking layer 104 cup an underside of the top electrode 106. For example, the bottom electrode barrier 502, the bottom electrode 110, the ferroelectric layer 108, the blocking layer 104 may each have U-shaped profiles or the like. The bottom electrode barrier 502 is between the bottom electrode 110 and the bottom electrode wire 304b and may, for example, be as the BEVA barrier 308 is described with regard to FIG. 3A.

With reference to FIG. 6B, a top layout view 600B of some embodiments of the memory cell 102 of FIG. 6A is provided. Further, a top layout of the TEVA 306t is illustrated in phantom overlaid on the memory cell 102. The cross-sectional view 600A of FIG. 6A may, for example, be taken along line C-C'. The bottom electrode barrier 502 extends in a closed path around the bottom electrode 110, the bottom electrode 110 extends in a closed path around the ferroelectric layer 108, the ferroelectric layer 108 extends in a closed path around the blocking layer 104, and the blocking layer 104 extends in a closed path around the top electrode 106. The memory cell 102 has a square or rectangular top layout, but may alternatively have a circular top layout or some other suitable top layout. The TEVA 306t has a square or rectangular top layout but may alternatively have other suitable top layouts.

Figure 7A:
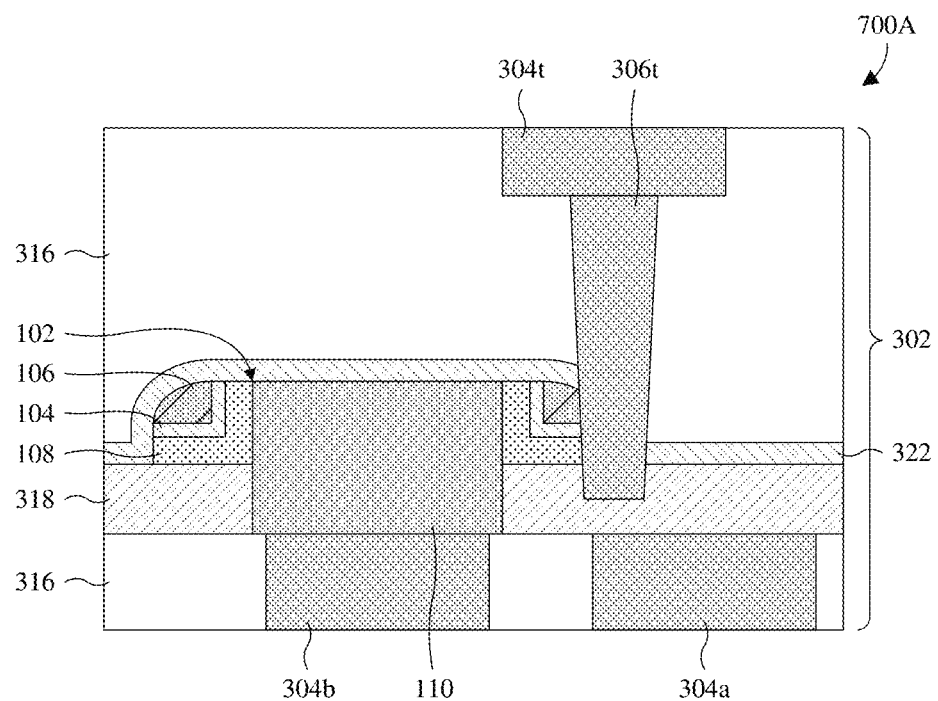
FIGS. 7A and 7B illustrate various views of some alternative embodiments of the memory cell of FIGS. 3A and 3B in which a top electrode surrounds a bottom electrode.

With reference to FIG. 7A, a cross-sectional view 700A of some alternative embodiments of the memory cell 102 of FIG. 3A is provided in which the BEVA 306b, the BEVA barrier 308, the BEVA body 310, the sidewall spacer structure 314, the second etch stop layer 320, and the hard mask 312 are omitted. As such, the memory cell 102 extends from the bottom electrode wire 304b. Further, an additional wire 304a underlies the TEVA 306t, level with the bottom electrode wire 304b, and the top electrode 106, the blocking layer 104, and the ferroelectric layer 108 form a sidewall spacer structure.

The sidewall spacer structure overlies the first etch stop layer 318 on top sidewall portions of the bottom electrode 110. Further, the sidewall spacer structure has a pair of spacer segments between which the bottom electrode 110 is arranged. The TEVA 306t extends to a portion of the top electrode 106 at one of these segments and further extends into the first etch stop layer 318. In at least some embodiments, the spacer segments are continuous with each other outside the cross-sectional view 800. The blocking layer 104 and the ferroelectric layer 108 have L-shaped portions at each of the spacer segments. The L-shaped portions of the ferroelectric layer 108 wrap around bottom corners of corresponding L-shaped portions of the blocking layer 104, and the L-shaped portions of the blocking layer 104 wrap around bottom corners of corresponding portions of the top electrode 106.

Figure 7B:
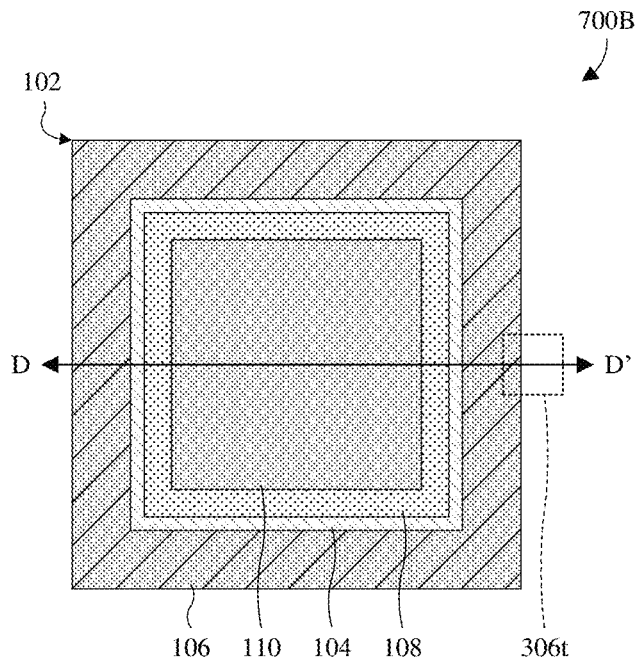

With reference to FIG. 7B, a top layout view 700B of some embodiments of the memory cell 102 of FIG. 7A is provided. Further, a top layout of the TEVA 306t is illustrated in phantom overlaid on the memory cell 102. The cross-sectional view 700A of FIG. 7A may, for example, be taken along line D-D'. The top electrode 106 extends in a closed path around the blocking layer 104, the blocking layer 104 extends in a closed path around the ferroelectric layer 108, and the ferroelectric layer 108 extends in a closed path around the bottom electrode 110. The memory cell 102 has a square or rectangular top layout, but may alternatively have a circular top layout or some other suitable top layout. The TEVA 306t has a square or rectangular top layout but may alternatively have other suitable top layouts.

Figure 8:
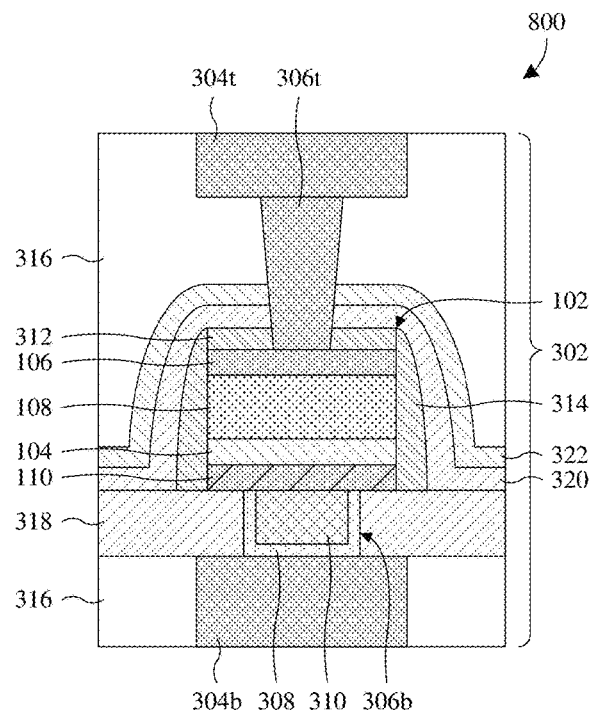
FIG. 8 illustrates a cross-sectional view of some alternative embodiments of the memory cell of FIGS. 3A and 3B in which the blocking layer is at a bottom electrode.
Figure 9A:
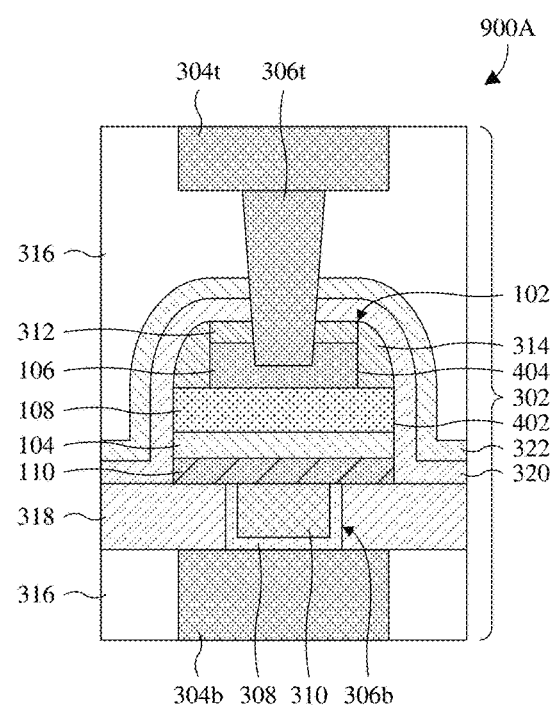
FIGS. 9A-9D illustrate cross-sectional views of some alternative embodiments of the memory cell of FIG. 8.
Figure 9B:
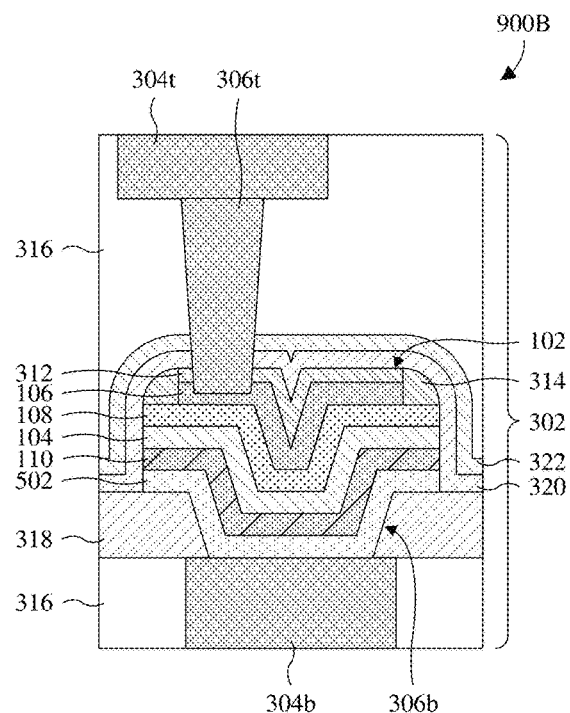
Figure 9C:
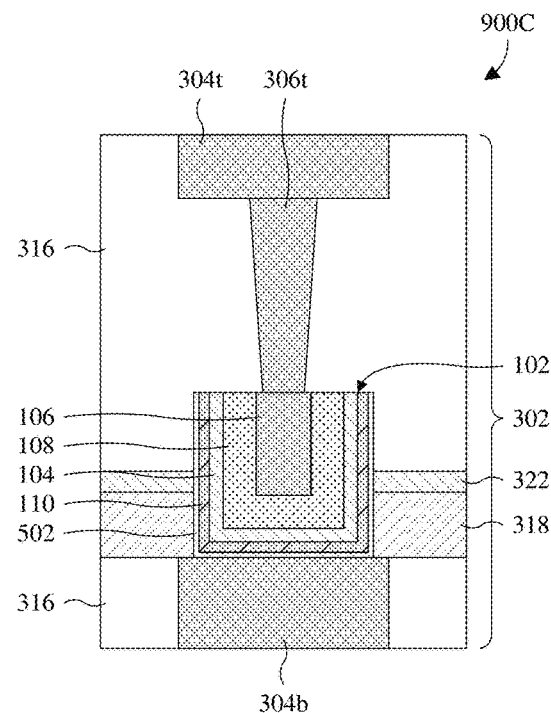
Figure 9D:
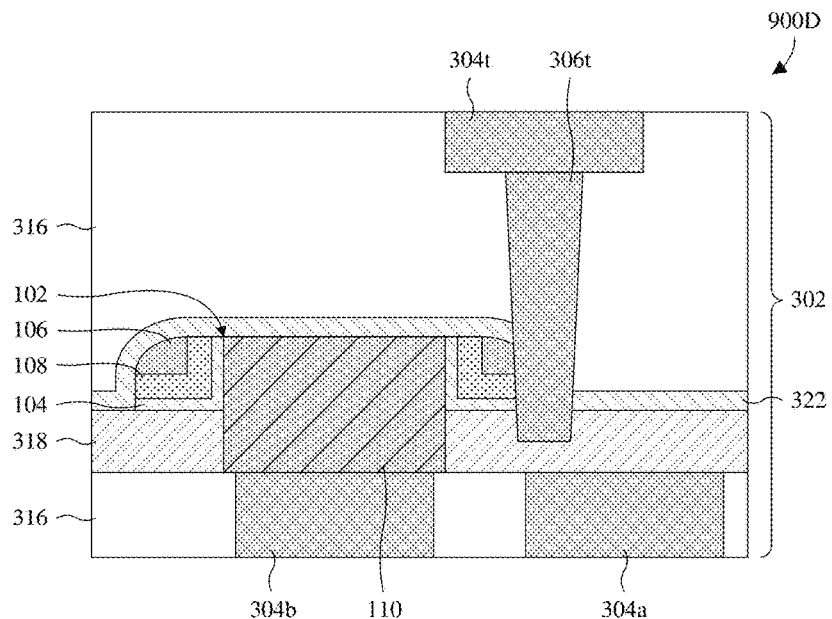

With reference to FIG. 8, a cross-sectional view 800 of some alternative embodiments of the memory cell 102 of FIGS. 3A and 3B is provided in which the blocking layer 104 is at the bottom electrode 110 as in FIG. 2A. Further, the metal of the bottom electrode 110 has the low electronegativity, whereas the metal of the top electrode 106 has the high electronegativity.

With reference to FIGS. 9A-9D, cross-sectional views 900A-900D of some alternative embodiments of the memory cell 102 of FIG. 8 are provided in which the memory cell 102 is configured respectively as in FIGS. 4A, 5, 6A, and 7A.

Figures 10, 11A:
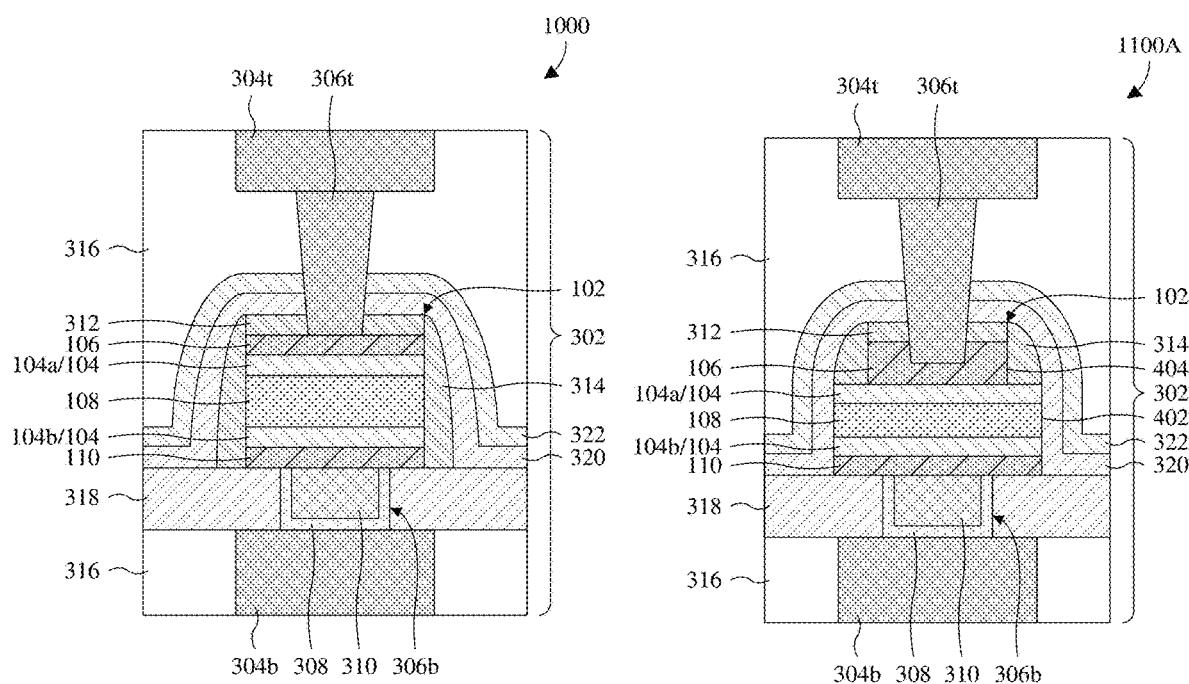
FIG. 10 illustrates a cross-sectional view of some alternative embodiments of the memory cell of FIGS. 3A and 3B in which the memory cell has a blocking layer at bottom electrode and a blocking layer at a top electrode.
FIGS. 11A-11D illustrate cross-sectional views of some alternative embodiments of the memory cell of FIG. 10.
Figures 11B, 11C:
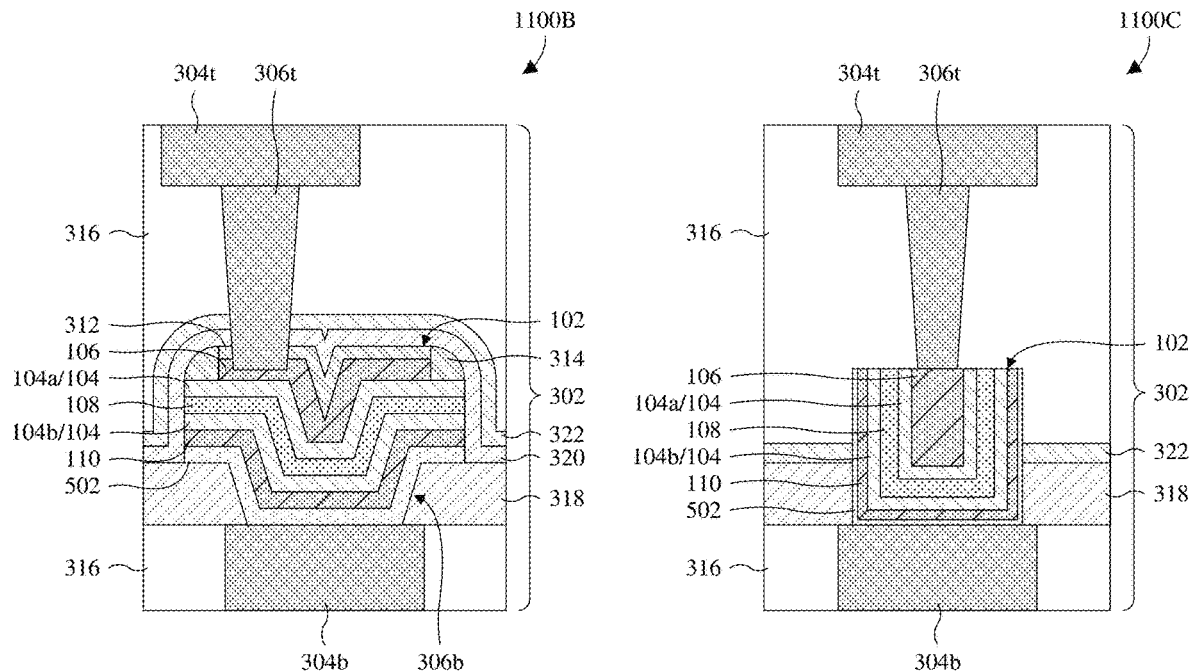
Figure 11D:
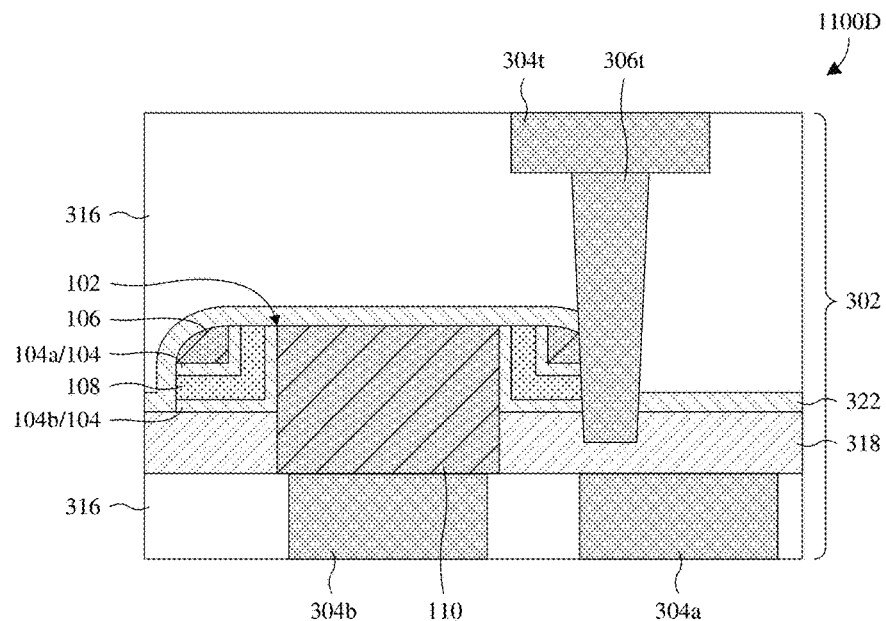

With reference to FIG. 10, a cross-sectional view 1000 of some alternative embodiments of the memory cell 102 of FIGS. 3A and 3B is provided in which the memory cell 102 has a pair of blocking layers 104 as in FIG. 2B. Further, the metal of the bottom electrode 110 and the metal of the top electrode 106 has the low electronegativity.

With reference to FIGS. 11A-11D, cross-sectional views 1100A-1100D of some alternative embodiments of the memory cell 102 of FIG. 10 are provided in which the memory cell 102 is configured respectively as in FIGS. 4A, 5, 6A, and 7A.

Figure 12A:
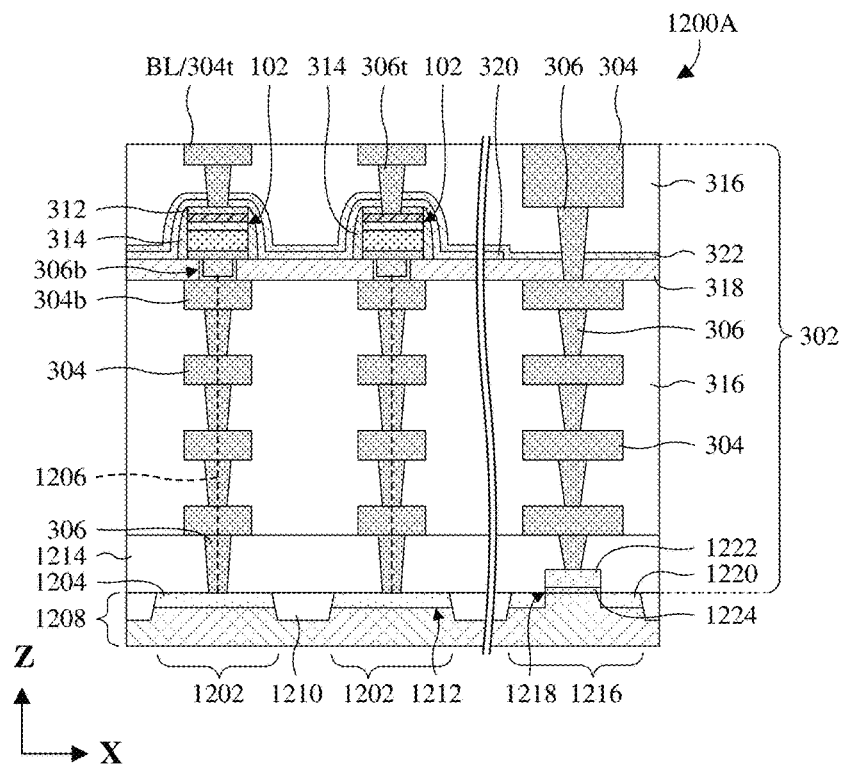
FIGS. 12A and 12B illustrate cross-sectional views of some embodiments of an IC chip comprising memory cells integrated into individual one-transistor one-capacitor (1T1C) cells and configured as in FIGS. 3A and 3B.

With reference to FIG. 12A, a cross-sectional view 1200A of some embodiments of an IC chip comprising memory cells 102 is provided, where the memory cells 102 are integrated into individual one-transistor one-capacitor (1T1C) cells 1202. The memory cells 102 are each as their counterpart is described with regard to FIGS. 3A and 3B.

The 1T1C cells 1202 comprise individual drain regions 1204 and individual drain-side conductive paths 1206. The drain regions 1204 are doped regions of a substrate 1208 and each has an opposite doping type as an adjoining region of the substrate 1208. Further, the drain regions 1204 are electrically separated by a trench isolation structure 1210 and partially define access transistors 1212 (partially shown) used to individually select the memory cells 102. The trench isolation structure 1210 extends into a top of the substrate 1208 and comprises silicon oxide and/or some other suitable dielectric material(s). The substrate 1208 may, for example, be a bulk silicon substrate or some other suitable semiconductor substrate.

The drain-side conductive paths 1206 electrically couple the drain regions 1204 to the memory cells 102 and are formed by an interconnect structure 302 within which the memory cells 102 are arranged. The interconnect structure 302 comprises a plurality of wires 304 and a plurality of vias 306. The plurality of wires 304 comprises top electrode wires 304t and bottom electrode wires 304b. In some embodiments, the top electrode wires 304t correspond to bit lines BL. The plurality of vias 306 comprises TEVAs 306t and BEVAs 306b. A level of the vias 306 nearest the substrate 1208 is in an interlayer dielectric (ILD) layer 1214, whereas remaining levels of the vias 306 and the wires 304 are in IMD layers 316. The wires 304 and the vias 306, except the BEVAs 306b, may be or comprise, for example, copper, aluminum, some other suitable metal(s), or any combination of the foregoing. The BEVAs 306b may, for example, be as their counterpart is described with regard to FIGS. 3A and 3B.

A peripheral region 1216 to a side of the 1T1C cells 1202 accommodates peripheral devices 1218 (only one of which is shown). The peripheral devices 1218 may, for example, be metal-oxide-semiconductor field-effect transistors (MOSFETs), fin field-effect transistors (finFETs), gate-all-around field-effect transistors (GAA FETs), or some other suitable type of semiconductor device. Each of the peripheral devices 1218 comprises a pair of source/drain regions 1220 in the substrate 1208, as well as a gate electrode 1222 and a gate dielectric layer 1224 stacked between the source/drain regions 1220.

Figure 12B:
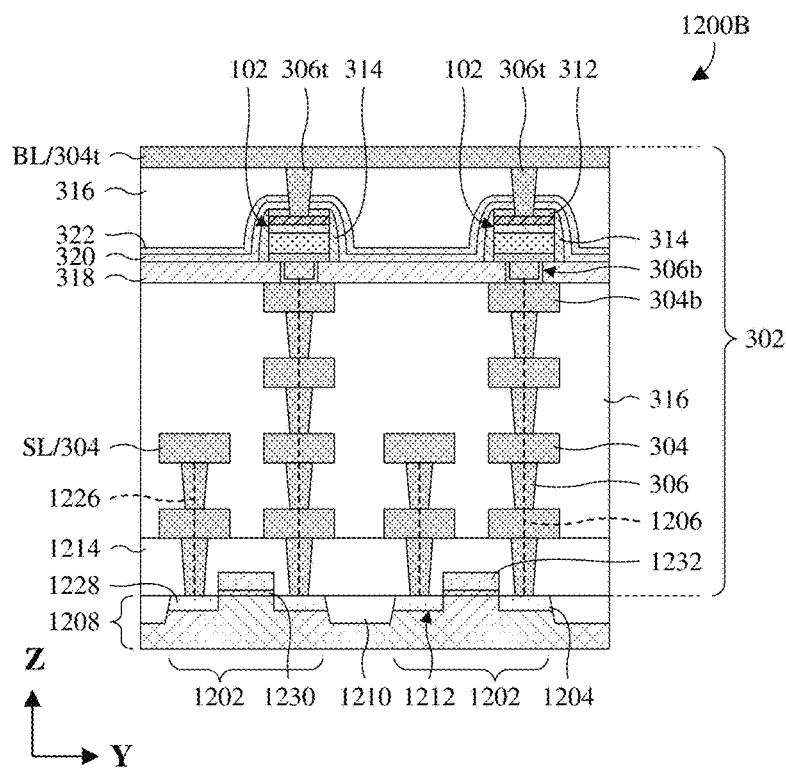

With reference to FIG. 12B, a cross-sectional view 1200B of some embodiments of the IC chip of FIG. 12A is provided along an axis orthogonal to that which the cross-sectional view 1200A of FIG. 12A is taken. The 1T1C cells 1202 comprise individual memory cells 102, individual drain-side conductive paths 1206, individual access transistors 1212, and individual source-side conductive paths 1226. The memory cells 102 are each as their counterpart is described with regard to FIGS. 3A and 3B.

The access transistors 1212 are on the substrate 1208, between the substrate 1208 and the interconnect structure 302, and are electrically separated by the trench isolation structure 1210. The access transistors 1212 comprise individual drain regions 1204, individual source regions 1228, individual gate dielectric layers 1230, and individual gate electrodes 1232. The gate electrodes 1232 respectively overlie the gate dielectric layers 1230 and, in some embodiments, form word lines. The drain and source regions 1204, 1228 are doped regions of the substrate 1208 and each has an opposite doping type as an adjoining region of the substrate 1208. Further, the drain and source regions 1204, 1228 respectively border the gate electrodes 1232. The access transistors 1212 may, for example, be MOSFETs, finFETs, GAA FETs, or some other suitable type of semiconductor device.

The drain-side conductive paths 1206 electrically couple the drain regions 1204 to the memory cells 102, and the source-side conductive paths 1226 electrically couple the source regions 1228 to source lines SL. The drain-side and source-side conductive paths 1206, 1226 are formed by the plurality of wires 304 and the plurality of vias 306.

Figure 13:
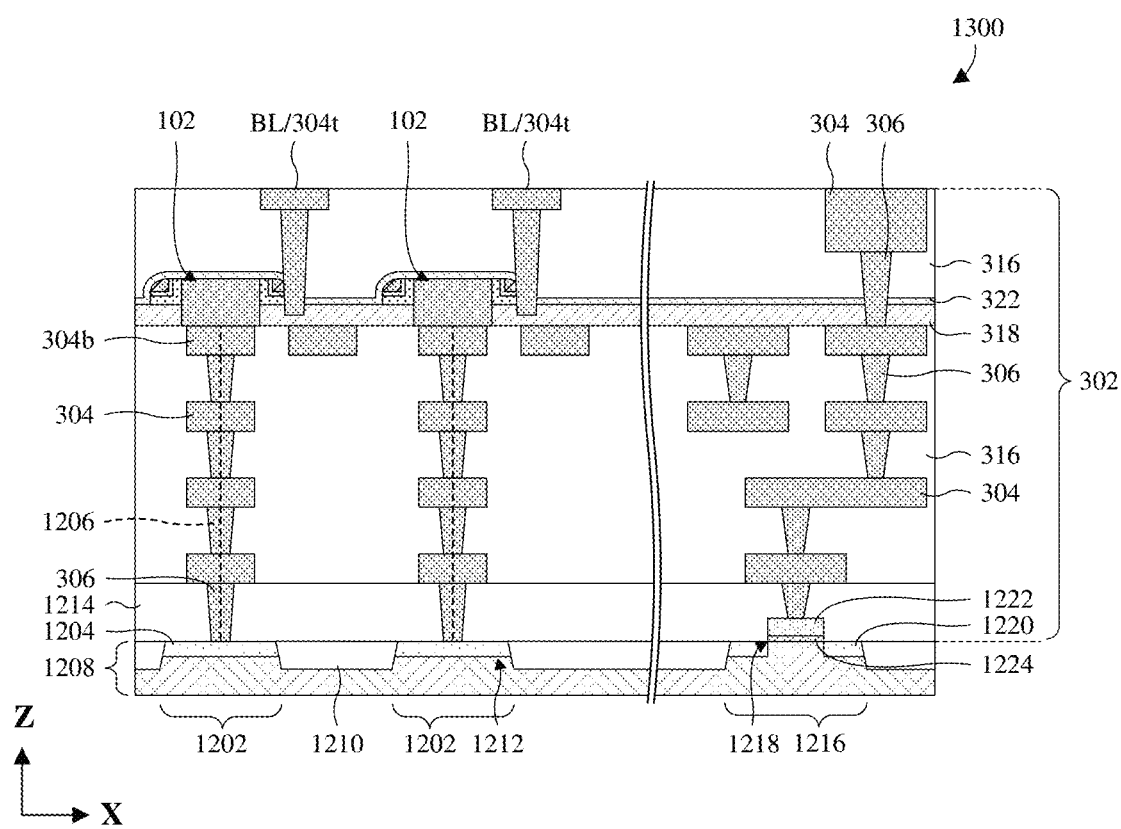
FIG. 13 illustrates a cross-sectional view of some alternative embodiments of the IC chip of FIGS. 12A and 12B.

While FIGS. 12A and 12B are illustrated using memory-cell embodiments as in FIGS. 3A and 3B, memory-cell embodiments as in any of FIGS. 1, 2A, 2B, 4A, 4B, 5, 6A, 6B, 7A, 7B, 8, 9A-9D, 10, and 11A-11D are amenable in alternative embodiments. For example, as illustrated by the cross-sectional view 1300 of FIG. 13, the memory cells 102 of FIGS. 12A and 12B may alternatively be configured as in FIGS. 7A and 7B.

Figure 14:
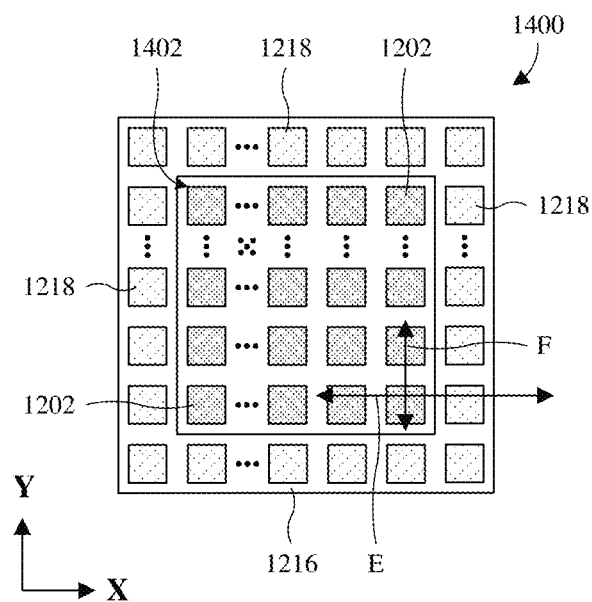
FIG. 14 illustrates a top layout view of some embodiments of the IC chip of FIGS. 12A and 12B.

With reference to FIG. 14, a top layout view 1400 of some embodiments of the IC chip of FIGS. 12A and 12B is provided. The cross-sectional views 1200A, 1200B of FIGS. 12A and 12B may, for example, respectively be taken along lines E and F. The IC chip comprises a plurality of 1T1C cells 1202 in a plurality of rows and a plurality of columns, thereby forming a memory array 1402. Peripheral devices 1218 surround the memory array 1402 at a peripheral region 1216 of the IC chip. The peripheral devices 1218 may, for example, implement read/write circuitry and/or other suitable circuitry for operating the 1T1C cells 1202.

Figure 15:
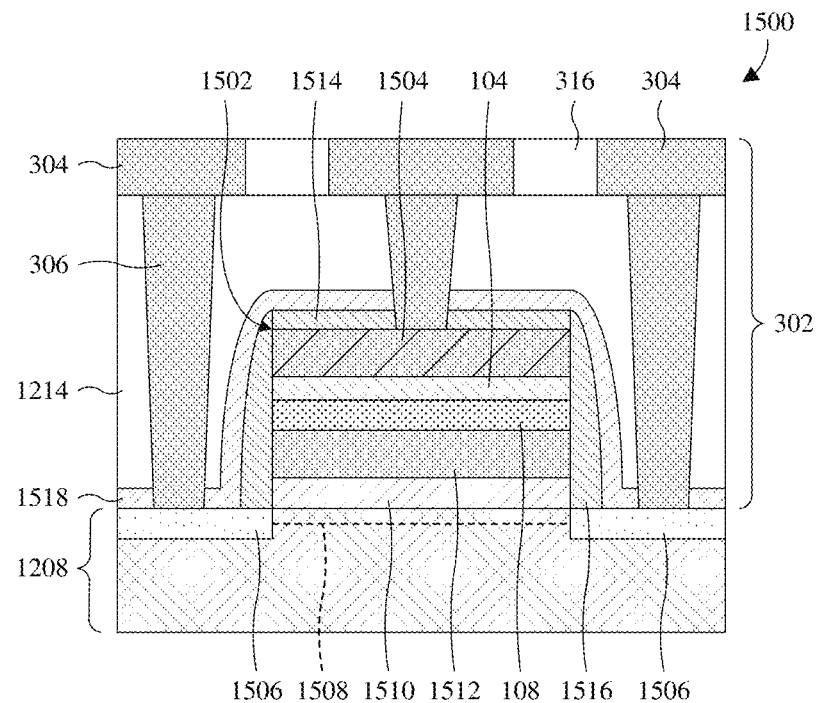
FIG. 15 illustrates a cross-sectional view of some embodiments of an IC chip comprising a ferroelectric field-effect transistor (FeFET) comprising a blocking layer.

With reference to FIG. 15, a cross-sectional view 1500 of some embodiments of an IC chip comprising a ferroelectric field-effect transistor (FeFET) 1502 in which a blocking layer 104 is configured to block diffusion of metal from a top gate electrode 1504 to a ferroelectric layer 108. A pair of source/drain regions 1506 is in a substrate 1208, and a channel region 1508 of the substrate 1208 separates the source/drain regions 1506. The source/drain regions 1506 may, for example, be doped regions of the substrate 1208 or the like.

A gate dielectric layer 1510, a floating gate electrode 1512, the ferroelectric layer 108, the blocking layer 104, the top gate electrode 1504, and a hard mask 1514 form a gate stack overlying the channel region 1508 and share a common width. In alternative embodiments, the floating gate electrode 1512 and/or the gate dielectric layer 1510 is/are omitted. The floating gate electrode 1512 and the top gate electrode 1504 are respectively as the bottom electrode 110 and the top electrode 106 are described with regard to FIG. 1. As such, the floating gate electrode 1512 has a high electronegativity, whereas the top gate electrode 1504 has a low electronegativity. Further, the blocking layer 104 and the ferroelectric layer 108 are as described with regard to any of FIG. 1, whereby the blocking layer 104 is configured to block metal of the top gate electrode 1504 from diffusing to the ferroelectric layer 108, thereby enhancing performance of the ferroelectric layer 108 and hence of the memory cell 102.

A sidewall spacer structure 1516 is on opposite sidewalls of the gate stack, and an interconnect structure 302 overlies and electrically couples to the FeFET 1502. The interconnect structure 302 comprises a plurality of wires 304 and a plurality of vias 306 stacked to define conductive paths leading from the FeFET 1502. While only one level of vias 306 and one level of wires 304 are shown, additional levels are amenable. A contact etch stop layer 1518 covers and lines the FeFET 1502, and an ILD layer 1214 and an IMD layer 316 are stacked over the contact etch stop layer 1518. The contact etch stop layer 1518 and the ILD layer 1214 surround the vias 306, and the IMD layer 316 surrounds the wires 304.

In some embodiments, the hard mask 1514 is or comprises titanium nitride, silicon oxide, silicon nitride, silicon carbide nitride, silicon oxide nitride, metal oxide, some other suitable material(s), or any combination of the foregoing. In some embodiments, the sidewall spacer structure 1516 is or comprises titanium nitride, silicon oxide, silicon nitride, silicon carbide nitride, silicon oxide nitride, metal oxide, some other suitable material(s), or any combination of the foregoing. In some embodiments, the contact etch stop layer 1518 is or comprises metal nitride, metal oxide, metal carbide, silicon nitride, silicon oxide, silicon carbide, silicon oxynitride, some other suitable dielectric(s), or any combination of the foregoing.

During operation of the FeFET 1502, the remanent polarization of the ferroelectric layer 108 is used to represent a bit of data. For example, a positive polarity of the remanent polarization may represent a binary "0", whereas a negative polarity of the remanent polarization may represent a binary "1", or vice versa.

To set the remanent polarization to the positive polarity, a first write voltage is applied across the ferroelectric layer 108 from the top gate electrode 1504 to the channel region 1508 (e.g., via the source/drain regions 1506). To set the remanent polarization to the negative polarity, a second write voltage is applied across the ferroelectric layer 108 from the top gate electrode 1504 to the channel region 1508. The first and second write voltage have opposite polarities and have magnitudes in excess of the coercive voltage.

The polarity of the remanent polarization shifts a threshold voltage of the FeFET 1502. Depending on whether the remanent polarization is in the positive polarity or the negative polarity, the threshold voltage is at a first threshold value or a second threshold value. To read the polarity of the remanent polarization, a read voltage less than the coercive voltage, and between the first and second threshold voltages, is applied from the top gate electrode 1504 to a source one of the source/drain regions 1506. Depending on whether the channel region 1508 conducts, the remanent polarization has the positive polarity or the negative polarity.

Figure 16A:
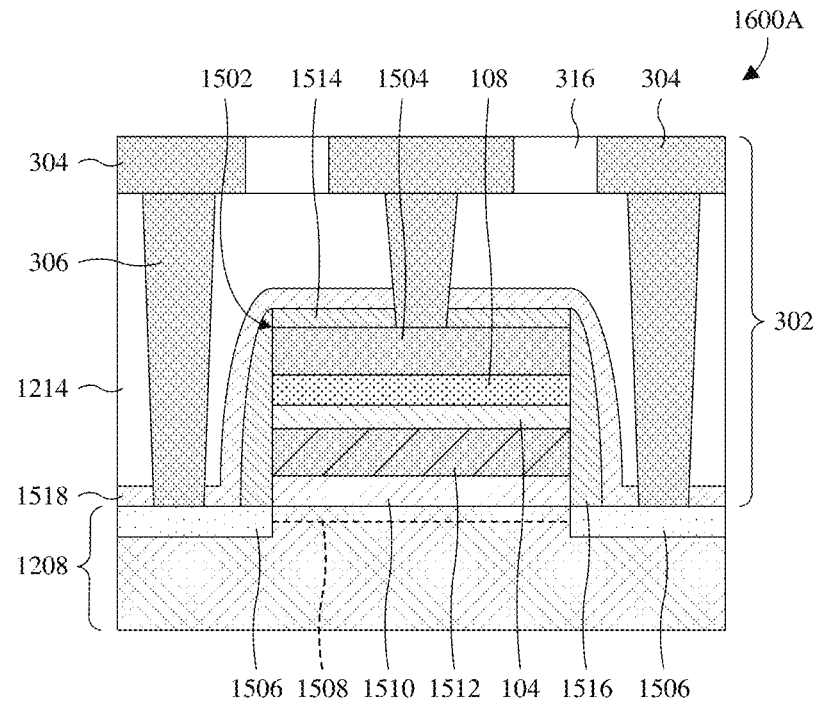
FIGS. 16A and 16B illustrate cross-sectional views of some alternative embodiments of the FeFET of FIG. 15.
Figure 16B:
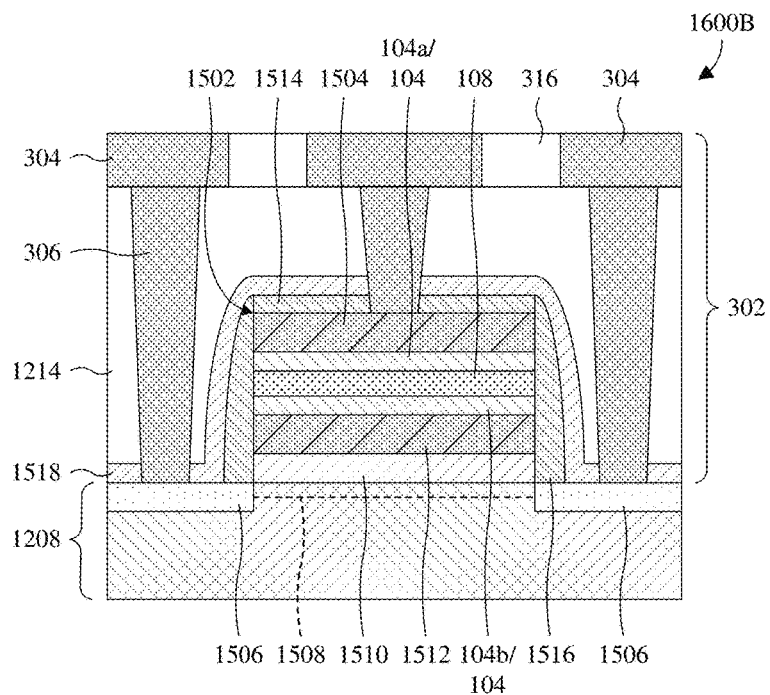

While FIG. 15 illustrates the FeFET 1502 with the blocking layer 104 at the top gate electrode 1504, the FeFET 1502 may alternatively have the blocking layer 104 at the floating gate electrode 1512 as illustrated in the cross-sectional view 1600A of FIG. 16A. In such alternative embodiments, the floating gate electrode 1512 has the low electronegativity, whereas the top gate electrode 1504 has the high electronegativity. Further, while FIG. 15 illustrates the FeFET 1502 with a single blocking layer 104, the FeFET 1502 may alternatively have a pair of blocking layers 104 as illustrated in the cross-sectional view 1600B of FIG. 16B. In such alternative embodiments, a first blocking layer 104a is between the top gate electrode 1504 and the ferroelectric layer 108, and a second blocking layer 104b is between the floating gate electrode 1512 and the ferroelectric layer 108. Further, the floating gate electrode 1512 and the top gate electrode 1504 both have the low electronegativity.

With reference to FIGS. 17-27, a series of cross-sectional views 1700-2700 of some embodiments of a method for forming an IC chip comprising memory cells is provided, where the memory cells are integrated into individual 1T1C cells and comprise blocking layers. The cross-sectional views 1700-2700 may, for example, correspond to the IC chip of FIGS. 12A and 12B and/or may, for example, be taken along line E in FIG. 14.

Figure 17:
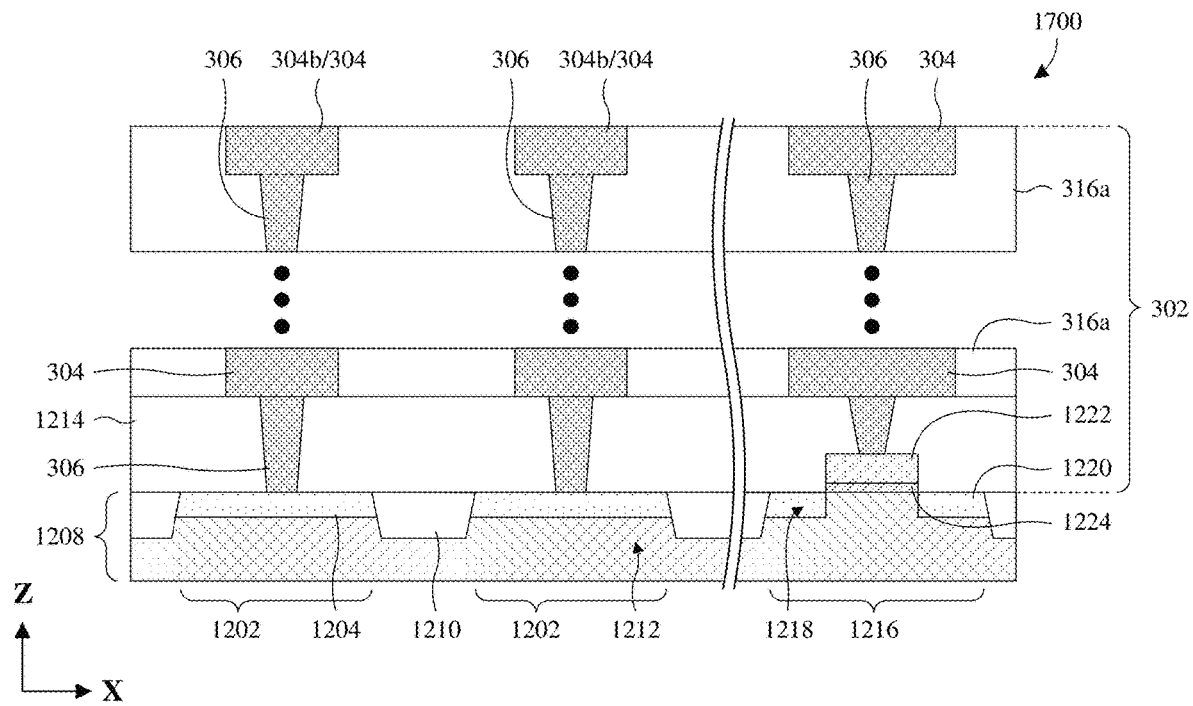
FIGS. 17-27 illustrate a series of cross-sectional views of some embodiments of a method for forming an IC chip comprising memory cells which are integrated into individual 1T1C cells and which comprise blocking layers.

As illustrated by a cross-sectional view 1700 of FIG. 17, an interconnect structure 302 is partially formed over and electrically coupled to a plurality of access transistors 1212 (only partially shown) and a peripheral device 1218. The access transistors 1212 are individual to and respectively at a plurality of 1T1C cells 1202 being formed, and the peripheral device 1218 is at a peripheral region 1216 of the IC chip being formed. The access transistors 1212 and the peripheral device 1218 are on and partially formed by a substrate 1208 and are separated by a trench isolation structure 1210 in the substrate 1208. The access transistors 1212 and the peripheral device 1218 may, for example, be as described with regard to FIGS. 12A and 12B.

The interconnect structure 302 comprises a plurality of wires 304 and a plurality of vias 306 that are stacked in a dielectric structure. The dielectric structure comprises an ILD layer 1214 and a first IMD layer 316a over the ILD layer 1214. The plurality of wires 304 comprises a plurality of bottom electrode wires 304b along a top surface of the interconnect structure 302. The bottom electrode wires 304b are individual to and respectively at the 1T1C cells 1202 being formed. Further, the bottom electrode wires 304b are respectively electrically coupled to drain regions 1204 of the access transistors 1212. The first IMD layer 316a may, for example, be formed by and/or using chemical vapor deposition (CVD), physical vapor deposition (PVD), atomic layer deposition (ALD), some other suitable deposition process(es), or any combination of the foregoing. The wires 304 and the vias 306 may, for example, be formed by and/or using CVD, PVD, ALD, electroless plating, electroplating, some other suitable deposition process(es), or any combination of the foregoing.

Figure 18:
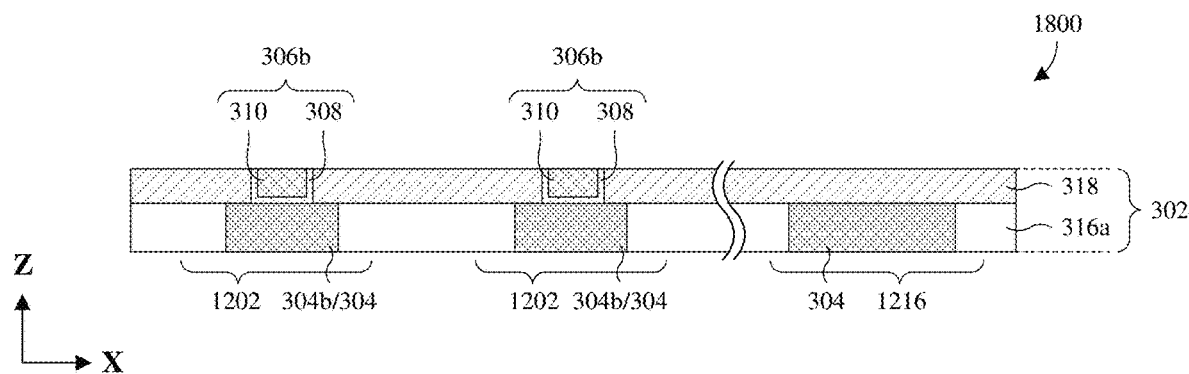

As illustrated by a cross-sectional view 1800 of FIG. 18, a first etch stop layer 318 is deposited or otherwise formed on the interconnect structure 302. Note that for drawing compactness, a lower portion of the interconnect structure 302 is omitted herein and in subsequent figures. The first etch stop layer 318 is a dielectric and may, for example, be deposited by CVD, PVD, ALD, some other suitable deposition process(es), or any combination of the foregoing.

Also illustrated by the cross-sectional view 1800 of FIG. 18, BEVAs 306b are formed extending through the first etch stop layer 318 respectively to the bottom electrode wires 304b. The BEVAs 306b comprise individual BEVA bodies 310 and individual BEVA barriers 308 respectively cupping undersides of the BEVA bodies 310. The BEVA bodies 310 and/or the BEVA barriers 308 may, for example, be formed by and/or using CVD, PVD, ALD, some other suitable deposition process(es), or any combination of the foregoing.

Figure 19:
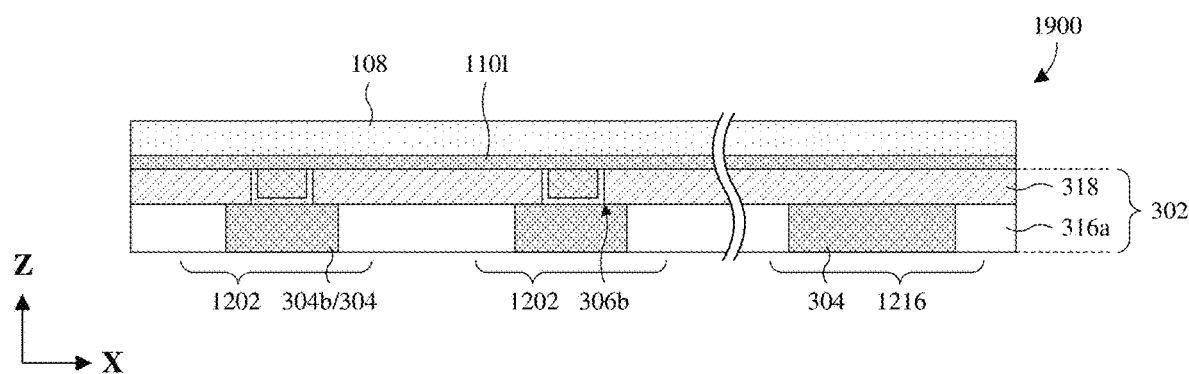

As illustrated by a cross-sectional view 1900 of FIG. 19, a bottom electrode layer 1101 is deposited over the BEVAs 306b and the first etch stop layer 318. The bottom electrode layer 1101 is conductive and is or comprises a metal with a high electronegativity. As such, the metal of the bottom electrode layer 1101 has low reactivity and hence a low propensity to diffuse. The bottom electrode layer 1101 may, for example, be deposited by CVD, PVD, ALD, some other suitable deposition process(es), or any combination of the foregoing.

In some embodiments, the high electronegativity is relative to an electronegativity of a top electrode layer hereafter formed. In some embodiments, the high electronegativity is an electronegativity greater than about 1.6, about 2.0, or some other suitable value, and/or is an electronegativity of about 1.6-2.4, about 1.6-2.0, about 2.0-2.4, or some other suitable value. In some embodiments, the high-electronegativity metal is or comprises molybdenum (e.g., Mo/an electronegativity of 2.16), tungsten (e.g., W/an electronegativity of 2.36), ruthenium (e.g., Ru/an electronegativity of 2.2), osmium (e.g., Os/an electronegativity of 2.18), rhodium (e.g., Rh/an electronegativity of 2.28), iridium (e.g., Jr/an electronegativity of 2.2), palladium (e.g., Pd/an electronegativity of 2.2), platinum (e.g., Pt/an electronegativity of 2.28), copper (e.g., Cu/an electronegativity of 1.9), silver (e.g., Ag/an electronegativity of 1.93), gold (e.g., Au/an electronegativity of 2.54), aluminum (e.g., Al/an electronegativity of 1.61), some other suitable conductive materials, or any combination of the foregoing.

Also illustrated by the cross-sectional view 1900 of FIG. 19, a ferroelectric layer 108 is deposited on the bottom electrode layer 1101. The deposition may, for example, be performed by CVD, PVD, ALD, the like, or any combination of the foregoing.

Figure 20:
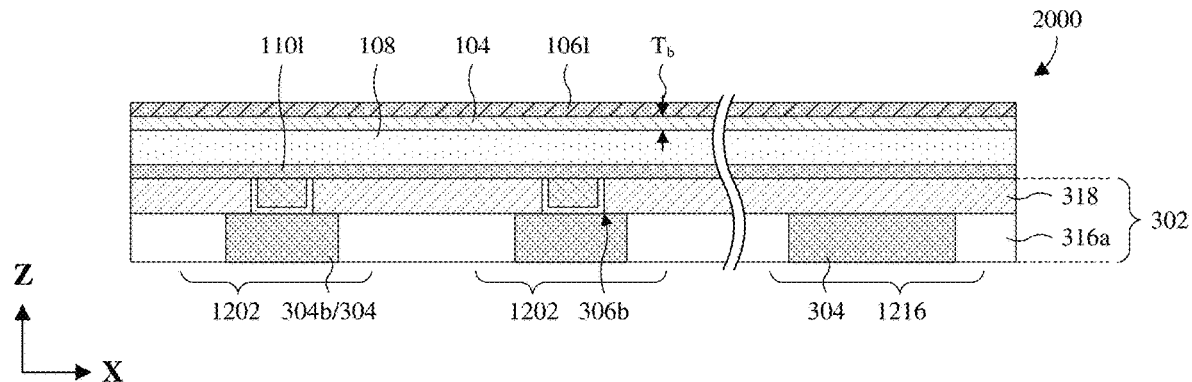

As illustrated by a cross-sectional view 2000 of FIG. 20, a blocking layer 104 is deposited on the ferroelectric layer 108, and a top electrode layer 1061 is deposited on the blocking layer 104. The blocking layer 104 may, for example, be deposited by CVD, PVD, ALD, some other suitable deposition process(es), or any combination of the foregoing. Similarly, the top electrode layer 1061 may, for example, be deposited by CVD, PVD, ALD, some other suitable deposition process(es), or any combination of the foregoing.

The top electrode layer 1061 comprises a metal with a low electronegativity, and the blocking layer 104 is configured to block diffusion of the metal to the ferroelectric layer 108. The low electronegativity is schematically illustrated by the diagonal hashing overlaid on the top electrode layer 1061. In some embodiments, the low electronegativity is low relative to an electronegativity of the bottom electrode layer 1101. In some embodiments, the low electronegativity is an electronegativity less than about 1.6, about 1.5, or some other suitable value, and/or is an electronegativity of about 1.1-1.6 or some other suitable value.

Because of the low electronegativity, the metal of the top electrode layer 1061 has high reactivity and hence a high propensity to diffuse to the ferroelectric layer 108. Metal that diffuses to the ferroelectric layer 108 negatively impacts performance of the ferroelectric layer 108. Therefore, by blocking diffusion of the metal from the top electrode layer 1061 to the ferroelectric layer 108, the blocking layer 104 enhances performance of the ferroelectric layer 108. For example, a ferroelectric phase may be increased, remnant polarization (2Pr) may be increased, polarization uniformity may be increased, leakage current may be decreased, capacitance may be increased, data retention may be increased, breakdown voltage may be increased, or any combination of the foregoing.

In contrast with the top electrode layer 1061, metal of the bottom electrode layer 1101 has a high electronegativity and hence a low propensity to diffuse to the ferroelectric layer 108. Therefore, diffusion of metal from the bottom electrode layer 1101 to the ferroelectric layer 108 may be of little concern and a blocking layer at the bottom electrode layer 1101 may be omitted without significantly impacting performance of the ferroelectric layer 108.

In some embodiments, the blocking layer 104 is or comprises silicon oxide (e.g., SiOx), silicon nitride (e.g., SiNx), metal oxide, a high k dielectric, some other suitable metal(s), or any combination of the foregoing. The high k dielectric may, for example, be a dielectric with a dielectric constant greater than about 3.9, about 10, or some other suitable value. In some embodiments, the blocking layer 104 is a dielectric. For example, the blocking layer 104 may be or comprise silicon oxide, silicon nitride, a high k dielectric, or some other suitable dielectric. In some embodiments, the blocking layer 104 is a semiconductor. For example, the blocking layer 104 may be or comprise a semiconductor metal oxide or some other suitable semiconductor material. In other embodiments, the block layer 104 is conductive. For example, the blocking layer 104 may be or comprise a conductive metal oxide or some other suitable semiconductor material.

In some embodiments, the blocking layer 104 comprises metal diffusing from the top electrode layer 1061 towards the ferroelectric layer 108. In some embodiments, the blocking layer 104 has an amorphous structure so as to eliminate grain boundaries and to increase diffusion-path complexity. Alternatively, in some embodiments, the blocking layer 104 has a nanocrystalline structure and grains of the blocking layer 104 are equiaxed grains, instead of columnar grains, so as to increase diffusion-path complexity. By increasing diffusion-path complexity, diffusion of metal thought the blocking layer 104 is reduced.

In some embodiments, the blocking layer 104 has a thickness Tb of about 2-50 angstroms, about 2-26 angstroms, about 26-50 angstroms, or some other suitable value. If the thickness Tb is too small (e.g., less than 2 angstroms), the blocking layer 104 may not effectively block diffusion of metal from the top electrode layer 1061 to the ferroelectric layer 108. If the thickness Tb is too large (e.g., more than 50 angstroms), a resistance of the blocking layer 104 may be too high and may lead to low current flow through the memory cell being formed.

In some embodiments, metal of the top electrode layer 1061 minimally diffuses to the ferroelectric layer 108 even with the blocking layer 104. For example, an atomic percentage of the metal in the ferroelectric layer 108 may be a non-zero value less than about 10%, about 5%, about 1%, or some other suitable percentage, and/or may be about 1%-10%, about 1%-5%, about 5%-10%, or some other suitable percentage. In some embodiments, the minimal diffusion wholly or mostly occurs during an anneal to increase a ferroelectric phase of the ferroelectric layer 108. In some of such embodiments, an atomic percentage of the metal in the ferroelectric layer 108 is less than 10% at completion of the anneal when the blocking layer 104 is present and is more than 30% at completion of the anneal when the blocking layer 104 is absent.

Figure 21:
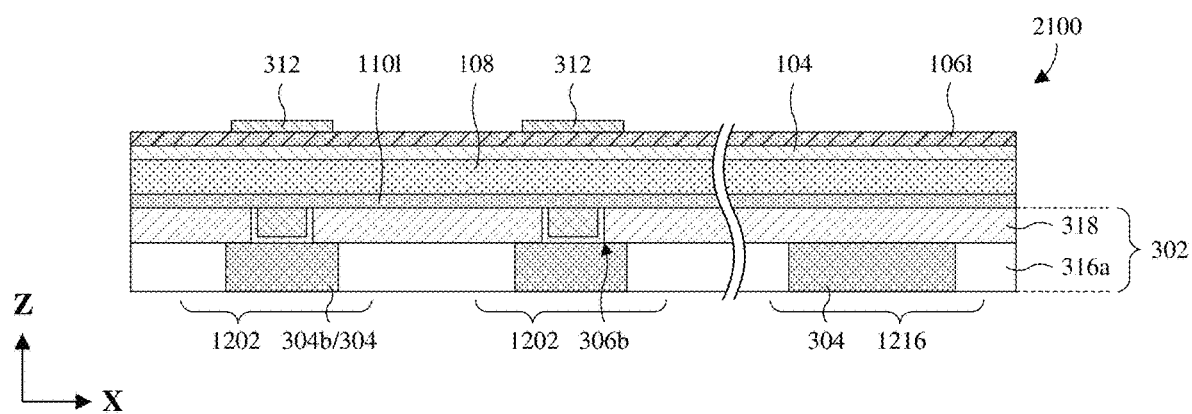

As illustrated by a cross-sectional view 2100 of FIG. 21, an anneal is performed to increase a ferroelectric phase in the ferroelectric layer 108. Note that the anneal is schematically illustrated by a change in hashing of the ferroelectric layer 108 from FIG. 20 to FIG. 21. The ferroelectric phase corresponds to the orthorhombic phase and is to be contrasted with the tetragonal phase and the monoclinic phase. The higher the ratio of the orthorhombic phase to other phases in the ferroelectric layer 108, the higher the remnant polarization (2Pr) and hence the better the data retention. The anneal may, for example, be performed at a temperature of about 300-1500 degrees Celsius, about 300-900 degrees Celsius, about 900-1500 degrees Celsius, or the like.

During the anneal, metal of the top and bottom electrode layers 1061, 1101 has a higher propensity to react and diffuse. However, metal of the bottom electrode layer 1101 still has low diffusivity during the anneal and hence has a minimal effect on the ferroelectric layer 108 during the anneal. In contrast, metal of the top electrode layer 1061 has an even higher diffusivity during the anneal. However, despite the higher diffusivity, the metal of the top electrode layer 1061 has a minimal effect on the ferroelectric layer 108 because the blocking layer 104 blocks diffusion of the metal to the ferroelectric layer 108. In some embodiments, an atomic percentage of the metal in the ferroelectric layer 108 is less than about 10%, 5%, or 1% at completion of the anneal when the blocking layer 104 is present and is more than about 30% at completion of the anneal when the blocking layer 104 is absent.

Also illustrated by the cross-sectional view 2100 of FIG. 21, hard masks 312 individual to the 1T1C cells 1202 being formed are formed. As seen hereafter, the hard masks 312 have patterns for memory cells being formed. A process for forming the hard masks 312 may, for example, comprise depositing a hard mask layer over the top electrode layer 1061 and subsequently patterning the hard mask layer into the hard masks 312. The depositing may, for example, be deposited by CVD, PVD, ALD, some other suitable deposition process(es), or any combination of the foregoing. The patterning may, for example, be performed by a photolithography/etching process or some other suitable patterning process.

Figure 22:
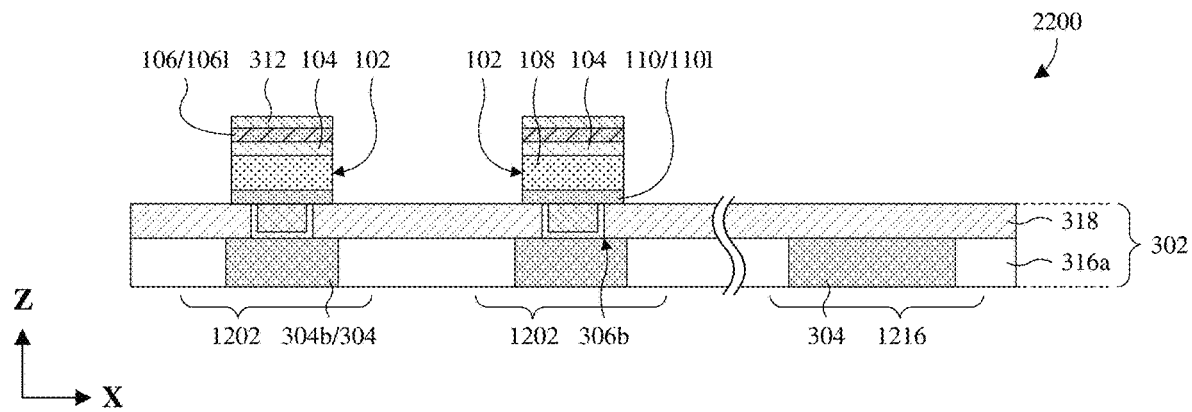

As illustrated by a cross-sectional view 2200 of FIG. 22, a etch is performed into the top electrode layer 1061, the blocking layer 104, the ferroelectric layer 108, and the bottom electrode layer 1101 with the hard masks 312 in place. In some embodiments in which the hard masks 312 are formed by a photolithography/etching process, an etch of the photolithography/etching process is the same as the etch into the top electrode layer 1061 and others. The etch stops on the first etch stop layer 318, whereby the first etch top layer 318 serves as an etch stop for the etch. Further, the etch transfers patterns of the hard masks 312 to the top electrode layer 1061, the blocking layer 104, the ferroelectric layer 108, and the bottom electrode layer 1101, thereby forming memory cells 102 respectively overlying and on the BEVAs 306b. Individual segments of the top electrode layer 1061 at the memory cells 102 are hereafter referred to as top electrodes 106, and individual segments of the bottom electrode layer 1101 at the memory cells 102 are hereafter referred to as bottom electrodes 110.

Figure 23:
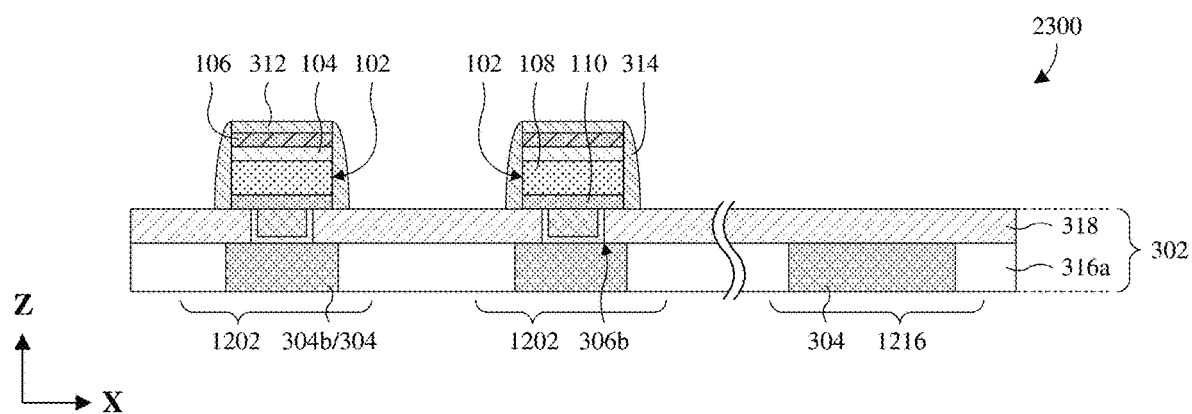

As illustrated by a cross-sectional view 2300 of FIG. 23, a sidewall spacer structure 314 is formed on common sidewalls formed by the hard masks 312, the top electrodes 106, the blocking layers 104, the ferroelectric layers 108, and the bottom electrodes 110. A process for forming the sidewall spacer structure 314 may, for example, comprise: 1) depositing a sidewall spacer layer on the memory cells 102; and 2) etching back the sidewall spacer layer. Other suitable processes are, however, amenable. The sidewall spacer layer may, for example, be deposited by CVD, PVD, ALD, some other suitable deposition process(es), or any combination of the foregoing.

As illustrated by cross-sectional views 2400-2700 of FIGS. 24-27, the interconnect structure 302 is completed over and around the memory cells 102.

Figure 24:
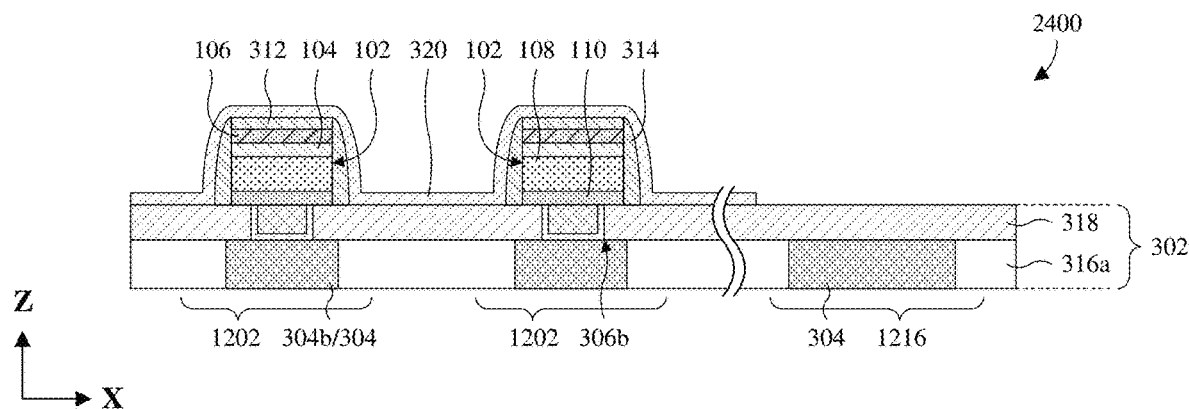

As illustrated by the cross-sectional view 2400 of FIG. 24, a second etch stop layer 320 is formed covering the memory cells 102 and laterally offset from the peripheral region 1216. A process for forming the second etch stop layer 320 as such may, for example, comprise: 1) depositing the second etch stop layer 320 covering the memory cells 102 and the peripheral region 1216; and 2) patterning the second etch stop layer 320 to remove it from the peripheral region 1216. Other suitable processes are, however, amenable. The second etch stop layer 320 may, for example, be deposited by CVD, PVD, ALD, some other suitable deposition process(es), or any combination of the foregoing. The patterning may, for example, be performed by a photolithography/etching process or some other suitable process.

Figure 25:
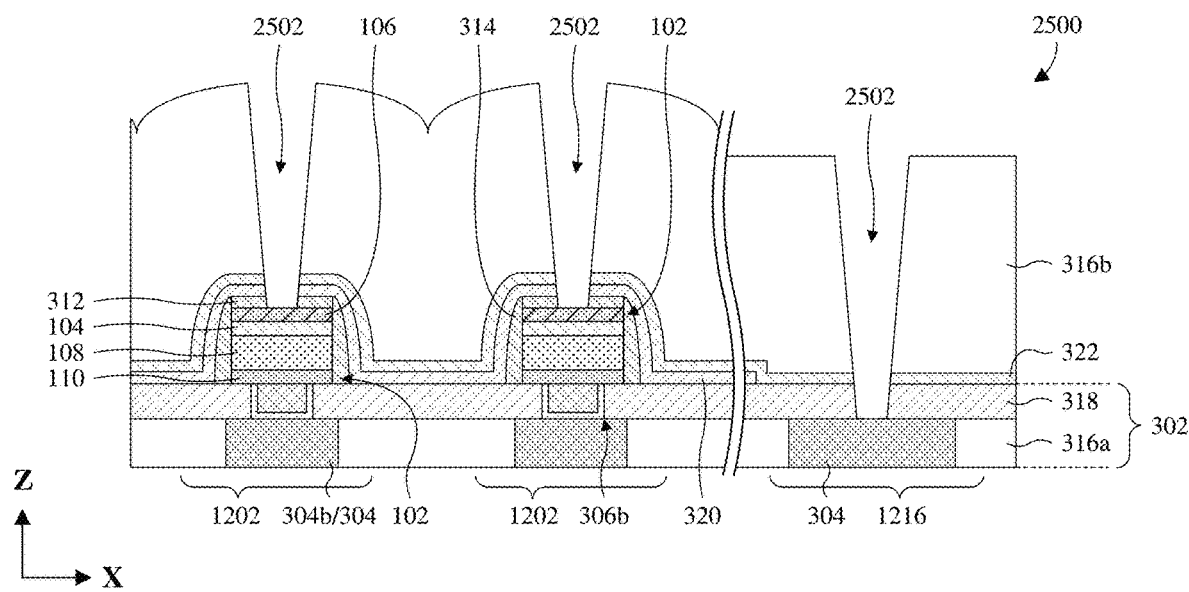

As illustrated by the cross-sectional view 2500 of FIG. 25, a buffer layer 322 and a second IMD layer 316b are deposited covering the memory cells 102 and the peripheral region 1216 over the first and second etch stop layers 318, 320. In alternative embodiments, the buffer layer 322 is omitted. The buffer layer 322 and/or the second IMD layer 316b may, for example, be deposited by CVD, PVD, ALD, some other suitable deposition process(es), or any combination of the foregoing.

Also illustrated by the cross-sectional view 2500 of FIG. 25, the second IMD layer 316b, the buffer layer 322, and the first and second etch stop layers 318, 320 are patterned to form a plurality of via opening 2502. The via openings 2502 respectively expose the top electrodes 106 at the memory cells 102 and a wire 304 at the peripheral region 1216. The patterning may, for example, be performed by one or more photolithography/etching process(es) and/or some other suitable patterning process(es). In some embodiments, the first and second etch stop layers 318, 320 serve as etch stops while performing the etching of the photolithography/etching process(es).

Figure 26:
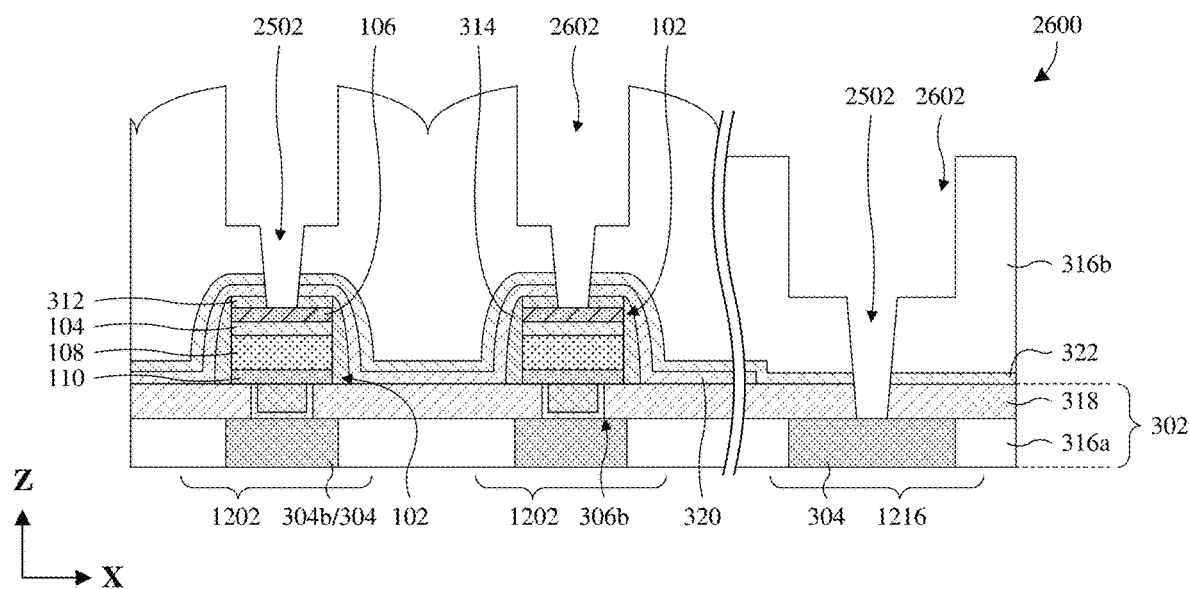

As illustrated by the cross-sectional view 2600 of FIG. 26, the second IMD layer 316b is further patterned to form a plurality of wire opening 2602 overlapping with the via openings 2502. The patterning may, for example, be performed by a photolithography/etching process and/or some other suitable patterning process(es).

Figure 27:
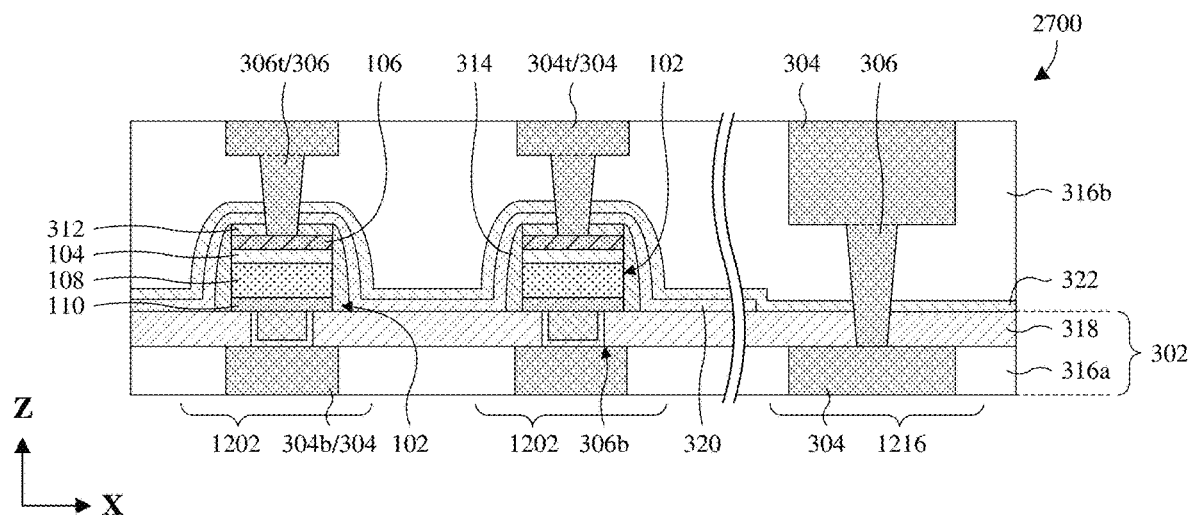

As illustrated by the cross-sectional view 2700 of FIG. 27, a plurality of additional wires 304 and a plurality of additional vias 306 are formed filling the via openings 2502 (see, e.g., FIG. 25) and the wire openings 2602 (see, e.g., FIG. 26). The plurality of additional wires 304 respectively fill the wire openings 2602 and comprise a plurality of top electrode wires 304t individual to and respectively overlying the memory cells 102. The plurality of additional vias 306 respectively fill the via openings 2502 and comprise a plurality of TEVAs 306t individual to and respectively at the top electrodes 106. Further, the TEVAs 306t extend respectively from the top electrode wires 304t respectively to the top electrodes 106.

A process for forming the additional wires 304 and the additional vias 306 may, for example, comprise: 1) depositing a metal layer filling the via openings 2502 and the wire openings 2602; and 2) performing a planarization into the metal layer and the second IMD layer 316b until top surfaces of the second IMD layer 316b and the metal layer are level with each other. Other suitable processes are, however, amenable. The metal layer may, for example, be deposited by CVD, PVD, ALD, electroless plating, electroplating, some other suitable deposition process(es), or any combination of the foregoing.

While FIGS. 17-27 are described with reference to a method, it will be appreciated that the structures shown in FIGS. 17-27 are not limited to the method but rather may stand alone separate of the method. While FIGS. 17-27 are described as a series of acts, it will be appreciated that the order of the acts may be altered in other embodiments. For example, instead of forming the blocking layer 104 between the ferroelectric layer 108 and the top electrode layer 106, the blocking layer 104 may be formed between the bottom electrode layer 1101 and the ferroelectric layer 108. In such embodiments, the metal of the bottom electrode layer 1101 has the low electronegativity, and the metal of the top electrode layer 1061 has the high electronegativity.

While FIGS. 17-27 illustrate and describe as a specific set of acts, some acts that are illustrated and/or described may be omitted in other embodiments. Further, acts that are not illustrated and/or described may be included in other embodiments. For example, another blocking layer may be formed between the bottom electrode layer 1101 and the ferroelectric layer 108. In such embodiments, the metal of the bottom electrode layer 1101 and the metal of the top electrode layer 1061 both have the low electronegativity and hence high diffusivity.

Figure 28:
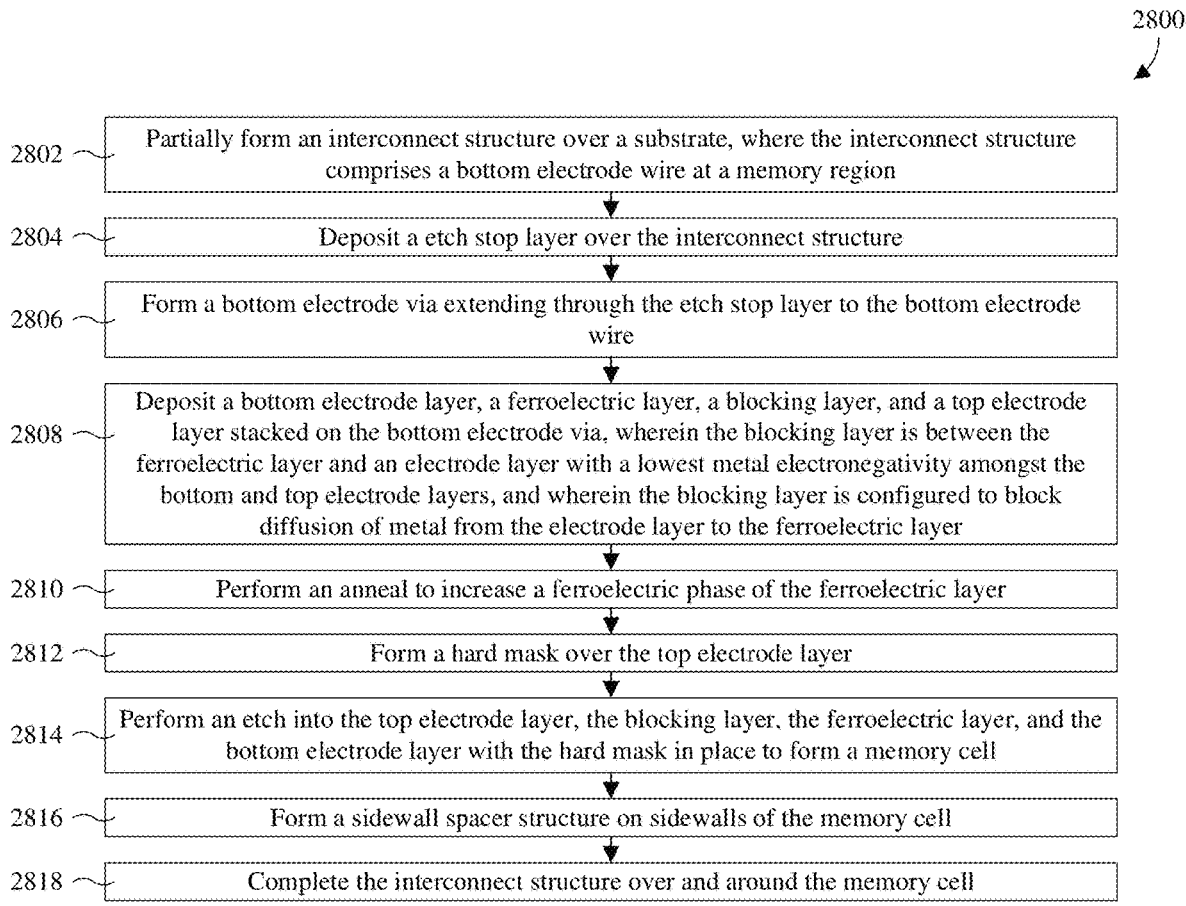
FIG. 28 illustrates a block diagram of some embodiments of the method of FIGS. 17-27.

With reference to FIG. 28, a block diagram 2800 of some embodiments of the method of FIGS. 17-27 is provided At 2802, an interconnect structure is partially formed over a substrate, where the interconnect structure comprises a bottom electrode wire at a memory region. See, for example, FIG. 17.

At 2804, an etch stop layer is deposited over the interconnect structure. See, for example, FIG. 18.

At 2806, a bottom electrode via is formed extending through the etch stop layer to the bottom electrode wire. See, for example, FIG. 18.

At 2808, a bottom electrode layer, a ferroelectric layer, a blocking layer, and a top electrode layer are deposited stacked on the bottom electrode via, wherein the blocking layer is between the ferroelectric layer and an electrode layer with a lowest metal electronegativity amongst the bottom and top electrode layers, and wherein the blocking layer is configured to block diffusion of metal from the electrode layer to the ferroelectric layer. See, for example, FIGS. 19 and 20.

At 2810, an anneal is performed to increase a ferroelectric phase of the ferroelectric layer. See, for example, FIG. 21.

At 2812, a hard mask is formed over the top electrode layer. See, for example, FIG. 21.

At 2814, an etch is performed into the top electrode layer, the blocking layer, the ferroelectric layer, and the bottom electrode layer with the hard mask in place to form a memory cell. See, for example, FIG. 22.

At 2816, a sidewall spacer structure is formed sidewalls of the memory cell. See, for example, FIG. 23.

At 2818, the interconnect structure is completed over and around the memory cell. See, for example, FIGS. 24-27.

While the block diagram 2800 of FIG. 28 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 29-36, a series of cross-sectional views 2900-3600 of some alternative embodiments of the method of FIGS. 17-27 is provided in which the memory cells 102 are formed as illustrated and described with regard to FIGS. 8A and 8B. As such, the IC chip formed by the method may, for example, correspond to the IC chip of FIG. 13.

Figure 29:
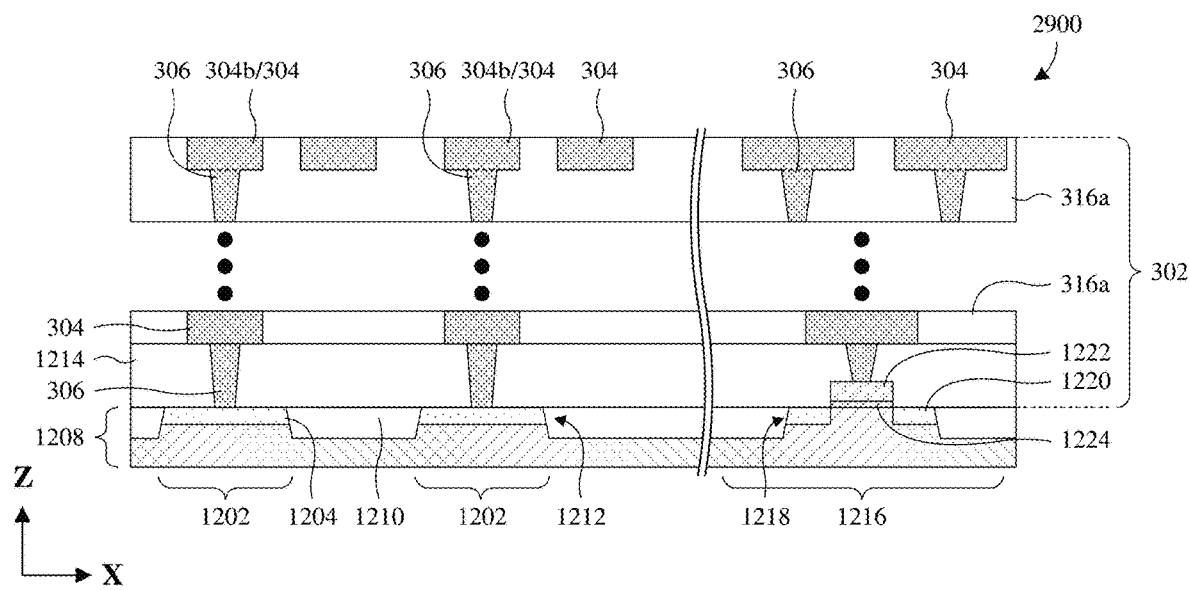
FIGS. 29-36 illustrate a series of cross-sectional views of some alternative embodiments of the method of FIGS. 17-27.

As illustrated by a cross-sectional view 2900 of FIG. 29, the acts described with regard to FIG. 17, except that the interconnect structure 302 has a different layout. For example, the interconnect structure 302 has additional wires along a top surface of the interconnect structure 302.

Figure 30:
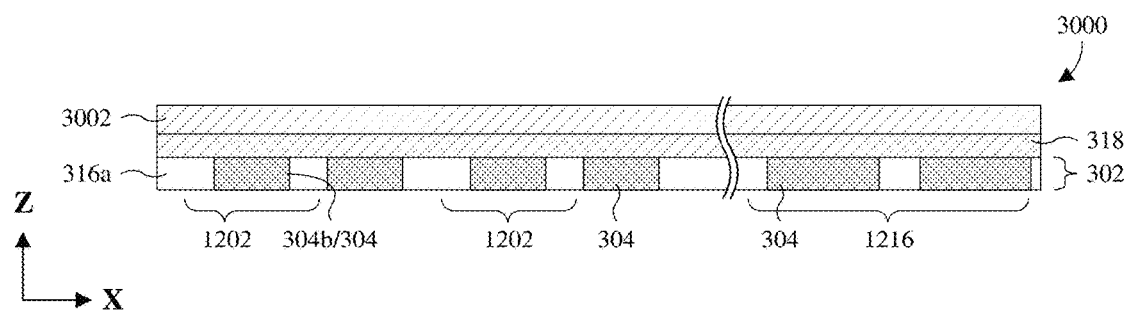

As illustrated by a cross-sectional view 3000 of FIG. 30, a first etch stop layer 318 and a sacrificial layer 3002 layer are deposited stacked over the interconnect structure 302, such that the first etch stop layer 318 is between the sacrificial layer 3002 and the first IMD layer 316a. The first etch stop layer 318 may, for example, be or comprise metal nitride, metal oxide, metal carbide, silicon nitride, silicon oxide, silicon carbide, silicon oxynitride, the like, or any combination of the foregoing. The sacrificial layer 3002 may, for example, be or comprise tetraethyl orthosilicate (TEOS) oxide and/or the like. The first etch stop layer 318 and the sacrificial layer 3002 may, for example, be deposited by CVD, PVD, ALD, some other suitable deposition process(es), or any combination of the foregoing.

Figure 31:
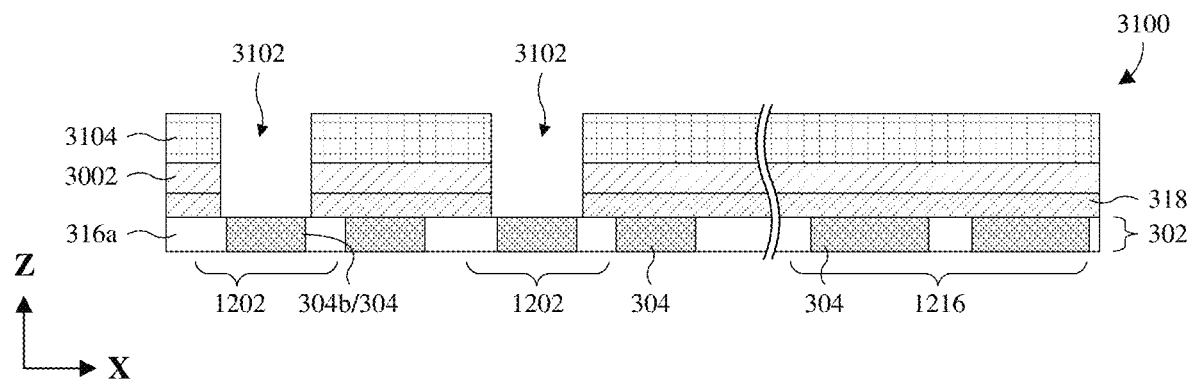

As illustrated by a cross-sectional view 3100 of FIG. 31, the first etch stop layer 318 and the sacrificial layer 3002 are patterned to form cell openings 3102 respectively exposing the bottom electrode wires 304b. The patterning may, for example, be performed by a photolithography/etching process or some other suitable patterning process. In some embodiments, the photolithography/etching comprises: 1) forming a photoresist mask 3104 overlying the sacrificial layer 3002 by photolithography; 2) performing an etch into the first etch stop layer 318 and the sacrificial layer 3002 with the photoresist mask 3104 in place; and 3) removing the photoresist mask 3104.

Figure 32:
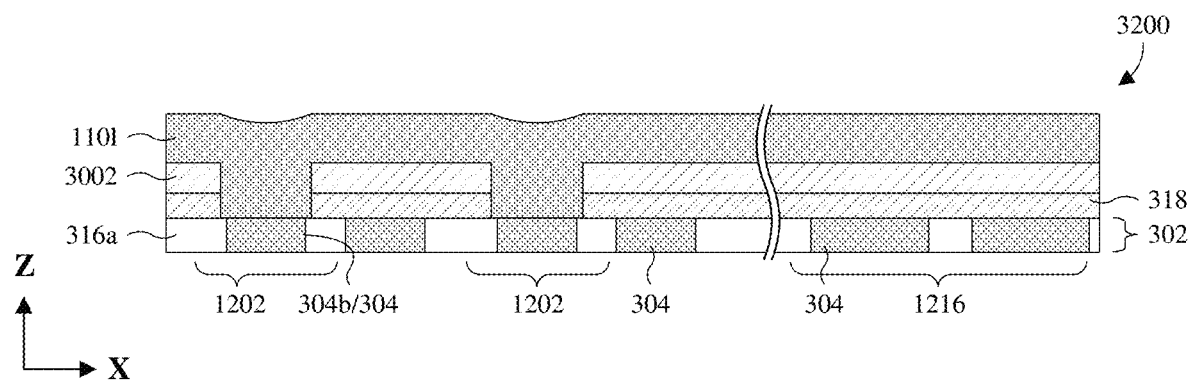

As illustrated by a cross-sectional view 3200 of FIG. 32, a bottom electrode layer 1101 is deposited over the sacrificial layer 3002, filling the cell openings 3102 (see, e.g., FIG. 31). In some embodiments, a bottom electrode barrier layer is first deposited lining the cell openings 3102 and the bottom electrode layer 1101 is deposited over the bottom electrode barrier layer. The bottom electrode layer 1101 and/or the bottom electrode barrier layer may, for example, be deposited by CVD, PVD, ALD, some other suitable deposition process(es), or any combination of the foregoing. The bottom electrode layer 1101 may, for example, be as described with regard to FIG. 19, and/or the bottom electrode barrier layer may, for example, be as the bottom electrode barrier 502 is described with regard to FIG. 5

Figure 33:
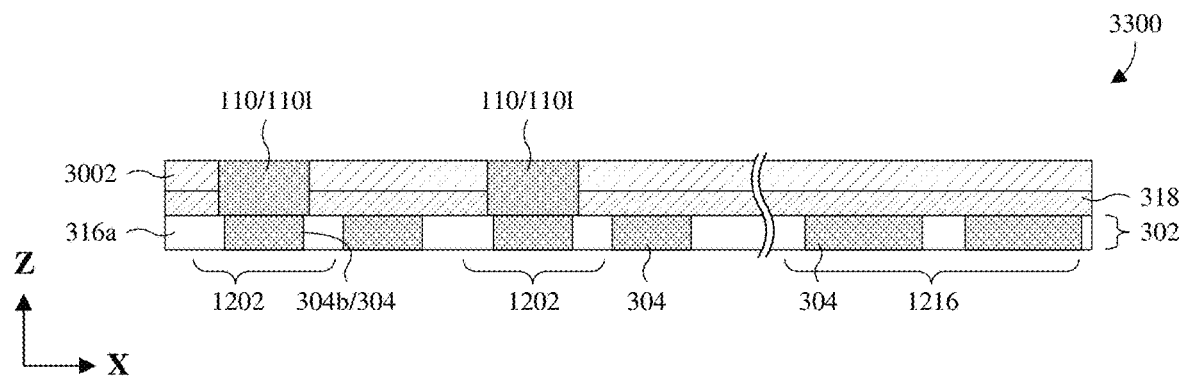

As illustrated by a cross-sectional view 3300 of FIG. 33, a top surface of the bottom electrode layer 1101 is recessed until level with or about level with a top surface of the sacrificial layer 3002. This segments the bottom electrode layer 1101 into bottom electrodes 110 individual to the memory cells being formed. The recessing may, for example, be performed by an etch back, a planarization, or the like. The planarization may, for example, be performed by a chemical mechanical polish (CMP) and/or some other suitable planarization.

Figure 34:
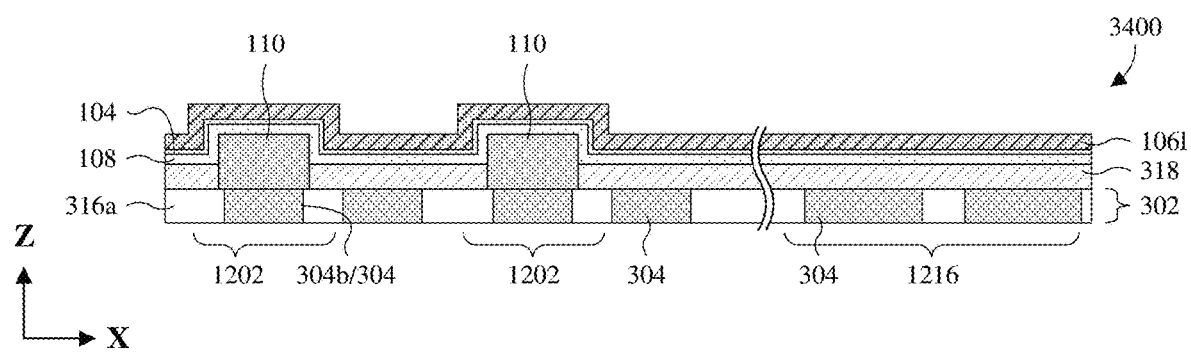

As illustrated by a cross-sectional view 3400 of FIG. 34, the sacrificial layer 3002 (see, e.g., FIG. 33) is removed. The removal may, for example, be performed by an etch or some other suitable removal process. To the extent that the removal is performed by an etch, the first etch stop layer 318 may serve as an etch stop for the etch.

Also illustrated by the cross-sectional view 3400 of FIG. 34, a ferroelectric layer 108, a blocking layer 104, and a top electrode layer 1061 are deposited stacked over the bottom electrodes 110 and the first etch stop layer 318. The blocking layer 104 overlies the ferroelectric layer 108, and the top electrode layer 1061 overlies the blocking layer 104. The ferroelectric layer 108, the blocking layer 104, and the top electrode layer 1061 may, for example, be despotized as described with regard to FIGS. 19 and 20.

Figure 35:
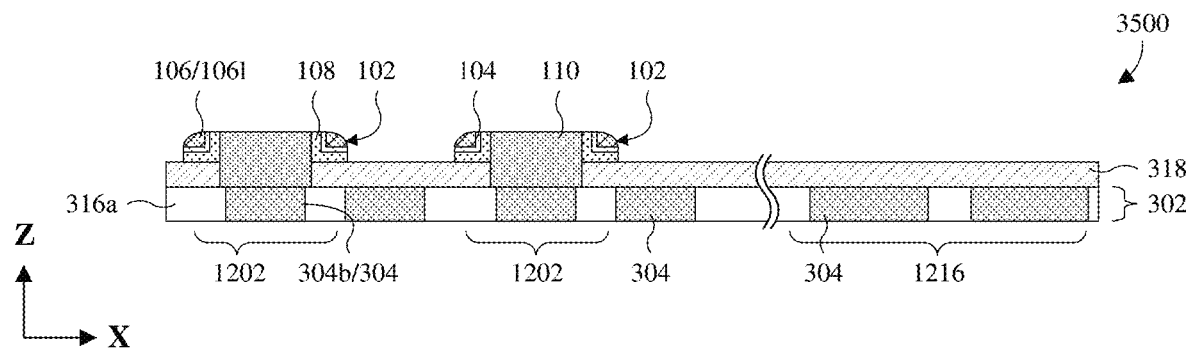

As illustrated by a cross-sectional view 3500 of FIG. 35, an anneal is performed to increase a ferroelectric phase in the ferroelectric layer 108 as described with regard to FIG. 21. Note that the anneal is schematically illustrated by a change in hashing of the ferroelectric layer 108 from FIG. 34 to FIG. 35.

Also illustrated by a cross-sectional view 3500 of FIG. 35, an etch back is performed into the ferroelectric layer 108, the blocking layer 104, and the top electrode layer 1061. The etch back may, for example, be performed by a vertical and/or anisotropic etch or the like. The etch back removes horizontal segments of the ferroelectric layer 108, the blocking layer 104, and the top electrode layer 1061, thereby localizing the ferroelectric layer 108, the blocking layer 104, and the top electrode layer 1061 to sidewalls (e.g., sidewalls of the bottom electrodes 110). Further, remaining segments of the top electrode layer 1061 on the sidewalls of the bottom electrodes 110 are hereafter referred to as top electrodes 106.

Figure 36:
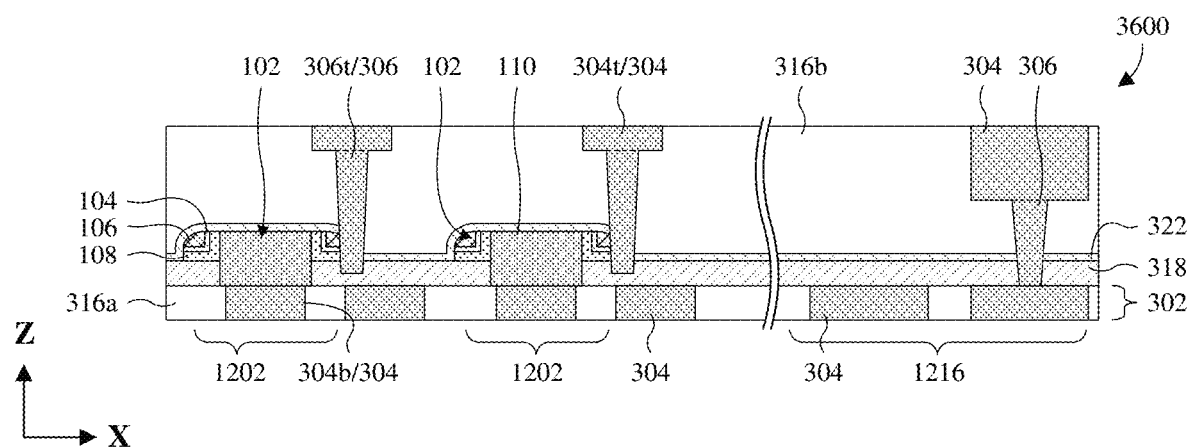

As illustrated by a cross-sectional view 3600 of FIG. 36, the acts described with regard to FIGS. 25-27 are performed to complete the interconnect structure 302 over and around the memory cells 102.

While FIGS. 29-36 are described with reference to a method, it will be appreciated that the structures shown in FIGS. 29-36 are not limited to the method but rather may stand alone separate of the method. While FIGS. 29-36 are described as a series of acts, it will be appreciated that the order of the acts may be altered in other embodiments. While FIGS. 29-36 illustrate and describe as a specific set of acts, some acts that are illustrated and/or described may be omitted in other embodiments. Further, acts that are not illustrated and/or described may be included in other embodiments.

In some embodiments, the present disclosure provides an IC chip including a memory cell, wherein the memory cell includes: a first electrode and a second electrode both including metal; a ferroelectric layer between the first and second electrodes; and a blocking layer between the ferroelectric layer and the first electrode; wherein the blocking layer is configured to block a first metal of the first electrode from diffusing to the ferroelectric layer, and wherein the first metal of the first electrode has a lower electronegativity than a second metal of the second electrode. In some embodiments, the blocking layer directly contacts the ferroelectric layer and the first electrode, wherein the second electrode directly contacts the ferroelectric layer. In some embodiments, the blocking layer is amorphous. In some embodiments, the blocking layer is a semiconductor. In some embodiments, the blocking layer is a conductive metal oxide. In some embodiments, the ferroelectric layer includes a non-zero atomic percentage of the first metal, which is less than about 10%.

In some embodiments, the present disclosure provides another IC chip including a memory cell, wherein the memory cell includes: a bottom electrode at a bottom of the memory cell; a top electrode at a top of the memory cell; a ferroelectric layer between the bottom and top electrodes; and a diffusion barrier layer between the ferroelectric layer and a first electrode, wherein the first electrode is one of the bottom and top electrodes, and wherein the first electrode includes a metal with an electronegativity less than about 1.6. In some embodiments, the memory cell further includes a second diffusion barrier layer between the ferroelectric layer and a second electrode, wherein the second electrode is another one of the bottom and top electrodes, and wherein the second electrode includes a metal with an electronegativity less than about 1.6. In some embodiments, the ferroelectric layer directly contacts a second electrode, wherein the second electrode is another one of the bottom and top electrodes, and wherein the second electrode includes a metal with an electronegativity greater than about 1.6. In some embodiments, the ferroelectric layer, the diffusion barrier layer, and one or both of the bottom and top electrodes share a common width. In some embodiments, the ferroelectric layer, the diffusion barrier layer, and the bottom electrode have individual U-shaped profiles wrapping around a bottom of the top electrode. In some embodiments, the top electrode extends in a closed path around the bottom electrode, wherein the top electrode has a bottom surface elevated relative to a bottom surface of the bottom electrode. In some embodiments, the ferroelectric layer and the diffusion barrier layer extend in individual closed paths around the bottom electrode and have individual bottom surfaces elevated relative to the bottom surface of the bottom electrode. In some embodiments, the IC chip further includes: a substrate; a semiconductor device overlying and partially defined by the substrate; and a plurality of wires and a plurality of vias respectively grouped into a plurality of wire levels and a plurality of via levels, which are alternatingly stacked over and electrically coupled to the semiconductor device, wherein the plurality of wires includes a bottom electrode wire and a top electrode wire between which the memory cell is arranged.

In some embodiments, the present disclosure provides a method including: forming a bottom electrode over a substrate; depositing a blocking layer, a ferroelectric layer, and a top electrode layer stacked over the substrate; patterning the top electrode layer to form a top electrode; and patterning the blocking and ferroelectric layers to delineate segments of the blocking and ferroelectric layers individual to a memory cell; wherein the bottom and top electrodes and the segments of the blocking and ferroelectric layers form the memory cell after the patterning of the blocking and ferroelectric layers, wherein the bottom and top electrodes include metal, and wherein the blocking layer is between the ferroelectric layer and an electrode with a lowest metal electronegativity amongst the bottom and top electrodes. In some embodiments, the method further includes: depositing a bottom electrode layer over the substrate, wherein the blocking layer, the ferroelectric layer, and the top electrode layer are deposited over the bottom electrode layer; and performing an etch into the bottom electrode layer, the ferroelectric layer, and the blocking layer with a common mask in place to pattern the bottom electrode layer into the bottom electrode and to further perform the patterning of the blocking and ferroelectric layers. In some embodiments, the etch is further performed into the top electrode layer with the common mask in place to perform the patterning of the top electrode layer. In some embodiments, the method further includes performing an anneal to increase a ferroelectric phase of the ferroelectric layer before the patterning of the top electrode layer and the patterning of the blocking and ferroelectric layers. In some embodiments, the blocking layer, the ferroelectric layer, and the top electrode layer are deposited overlying the bottom electrode and on sidewalls of the bottom electrode. In some embodiments, the forming of the bottom electrode includes: depositing a sacrificial layer overlying a dielectric layer, which covers a conductive wire; performing an etch through the dielectric layer and the sacrificial layer to form an opening exposing the conductive wire; depositing a bottom electrode layer in the opening; performing a planarization into the bottom electrode layer to a top surface of the sacrificial layer; and removing the sacrificial layer. In some embodiments, the patterning of the top electrode layer and the blocking and ferroelectric layers includes: performing an etch back into the top electrode layer, the blocking layer, and the ferroelectric layer to remove horizontally extending segments of the top electrode layer, the blocking layer, and the ferroelectric layer and to form a sidewall structure on top sidewall portions of the bottom electrode, wherein the sidewall structure includes the top electrode and the segments of the blocking and ferroelectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip comprising a memory cell, wherein the memory cell comprises:
    a first electrode and a second electrode both comprising metal;
    a ferroelectric layer between the first and second electrodes; and
    a blocking layer between the ferroelectric layer and the first electrode;
    wherein the blocking layer is configured to block a first metal of the first electrode from diffusing to the ferroelectric layer, and wherein the first metal of the first electrode has a lower electronegativity than a second metal of the second electrode.

2. The IC chip according to claim 1, wherein the blocking layer directly contacts the ferroelectric layer and the first electrode, and wherein the second electrode directly contacts the ferroelectric layer.

3. The IC chip according to claim 1, wherein the blocking layer is amorphous.

4. The IC chip according to claim 1, wherein the blocking layer is a semiconductor.

5. The IC chip according to claim 1, wherein the blocking layer is a conductive metal oxide.

6. The IC chip according to claim 1, wherein the ferroelectric layer comprises a non-zero atomic percentage of the first metal, which is less than about 10%.

7. An integrated circuit (IC) chip comprising a memory cell, wherein the memory cell comprises:
    a bottom electrode at a bottom of the memory cell;
    a top electrode at a top of the memory cell;
    a ferroelectric layer between the bottom and top electrodes; and
    a diffusion barrier layer between the ferroelectric layer and a first electrode, wherein the first electrode is one of the bottom and top electrodes, and wherein the first electrode comprises a metal with an electronegativity less than about 1.6.

8. The IC chip according to claim 7, wherein the memory cell further comprises:
    a second diffusion barrier layer between the ferroelectric layer and a second electrode, wherein the second electrode is another one of the bottom and top electrodes, and wherein the second electrode comprises a metal with an electronegativity less than about 1.6.

9. The IC chip according to claim 7, wherein the ferroelectric layer directly contacts a second electrode, wherein the second electrode is another one of the bottom and top electrodes, and wherein the second electrode comprises a metal with an electronegativity greater than about 1.6.

10. The IC chip according to claim 7, wherein the ferroelectric layer, the diffusion barrier layer, and one or both of the bottom and top electrodes share a common width.

11. The IC chip according to claim 7, wherein the ferroelectric layer, the diffusion barrier layer, and the bottom electrode have individual U-shaped profiles wrapping around a bottom of the top electrode.

12. The IC chip according to claim 7, wherein the top electrode extends in a closed path around the bottom electrode, and wherein the top electrode has a bottom surface elevated relative to a bottom surface of the bottom electrode.

13. The IC chip according to claim 12, wherein the ferroelectric layer and the diffusion barrier layer extend in individual closed paths around the bottom electrode and have individual bottom surfaces elevated relative to the bottom surface of the bottom electrode.

14. The IC chip according to claim 12, further comprising:
a substrate;
a semiconductor device overlying and partially defined by the substrate; and
a plurality of wires and a plurality of vias respectively grouped into a plurality of wire levels and a plurality of via levels, which are alternatingly stacked over and electrically coupled to the semiconductor device, wherein the plurality of wires comprises a bottom electrode wire and a top electrode wire between which the memory cell is arranged.

15. A method comprising:
forming a bottom electrode over a substrate;
depositing a blocking layer, a ferroelectric layer, and a top electrode layer stacked over the substrate;
patterning the top electrode layer to form a top electrode; and
patterning the blocking and ferroelectric layers to delineate segments of the blocking and ferroelectric layers individual to a memory cell;
wherein the bottom and top electrodes and the segments of the blocking and ferroelectric layers form the memory cell after the patterning of the blocking and ferroelectric layers,
wherein the bottom and top electrodes comprise metal, and
wherein the blocking layer is between the ferroelectric layer and an electrode with a lowest metal electronegativity amongst the bottom and top electrodes.

16. The method according to claim 15, further comprising:
depositing a bottom electrode layer over the substrate, wherein the blocking layer, the ferroelectric layer, and the top electrode layer are deposited over the bottom electrode layer; and
performing an etch into the bottom electrode layer, the ferroelectric layer, and the blocking layer with a common mask in place to pattern the bottom electrode layer into the bottom electrode and to further perform the patterning of the blocking and ferroelectric layers.

17. The method according to claim 15, further comprising:
performing an anneal to increase a ferroelectric phase of the ferroelectric layer before the patterning of the top electrode layer and the patterning of the blocking and ferroelectric layers.

18. The method according to claim 15, wherein the blocking layer, the ferroelectric layer, and the top electrode layer are deposited overlying the bottom electrode and on sidewalls of the bottom electrode.

19. The method according to claim 18, wherein the forming of the bottom electrode comprises:
depositing a sacrificial layer overlying a dielectric layer, which covers a conductive wire;
performing an etch through the dielectric layer and the sacrificial layer to form an opening exposing the conductive wire;
depositing a bottom electrode layer in the opening;
performing a planarization into the bottom electrode layer to a top surface of the sacrificial layer; and
removing the sacrificial layer.

20. The method according to claim 18, wherein the patterning of the top electrode layer and the blocking and ferroelectric layers comprises:
performing an etch back into the top electrode layer, the blocking layer, and the ferroelectric layer to remove horizontally extending segments of the top electrode layer, the blocking layer, and the ferroelectric layer and to form a sidewall structure on top sidewall portions of the bottom electrode, wherein the sidewall structure comprises the top electrode and the segments of the blocking and ferroelectric layers.

* * * * *